United States Patent [19]

Ward

[11] Patent Number: 5,672,949
[45] Date of Patent: Sep. 30, 1997

[54] ELECTRONICS FOR CORIOLIS FORCE AND OTHER SENSORS

[75] Inventor: Paul Ward, Waltham, Mass.

[73] Assignee: The Charles Stark Draper Laboratory, Inc., Cambridge, Mass.

[21] Appl. No.: 449,020

[22] Filed: May 24, 1995

Related U.S. Application Data

[62] Division of Ser. No. 219,023, Mar. 28, 1994, Pat. No. 5,481,914.

[51] Int. Cl.$^6$ .............................. G11B 33/00; G01P 9/04
[52] U.S. Cl. .......................... 318/609; 318/603; 318/610; 73/504.16
[58] Field of Search .................. 318/560–696, 318/490; 244/3.17, 3.11; 364/570, 565, 484, 481, 480, 485; 329/307, 325, 341, 343, 356, 360; 331/27, 60; 367/135, 901; 73/1 D, 517 A, 517 AV, 517 R, 505, 504; 375/327, 328, 376

[56] References Cited

U.S. PATENT DOCUMENTS

| | | | |
|---|---|---|---|
| H796 | 7/1990 | Miller, Jr. et al. | 244/3.17 |
| 3,660,744 | 5/1972 | Plummer | 318/616 |
| 3,678,593 | 7/1972 | Baker et al. | 33/355 |
| 3,777,242 | 12/1973 | Tribuno et al. | 318/586 |
| 3,793,593 | 2/1974 | Kennedy et al. | 330/103 |
| 3,931,515 | 1/1976 | Parkin | 250/216 |
| 4,144,764 | 3/1979 | Hartzell, Jr. | 73/497 |
| 4,277,039 | 7/1981 | Blanning et al. | 244/3.16 |
| 4,277,173 | 7/1981 | Ljung et al. | 356/350 |
| 4,293,815 | 10/1981 | West et al. | 324/254 |
| 4,336,718 | 6/1982 | Washburn | 73/517 B |
| 4,345,474 | 8/1982 | Deval | 73/517 B |
| 4,445,376 | 5/1984 | Merhav | 73/510 |
| 4,500,801 | 2/1985 | Mehav | 73/505 |
| 4,565,970 | 1/1986 | Rider | 329/50 |
| 4,566,327 | 1/1986 | Rider | 73/510 |
| 4,569,593 | 2/1986 | Auch et al. | 356/350 |
| 4,578,650 | 3/1986 | Watson | 381/160 |
| 4,606,637 | 8/1986 | Geen | 356/350 |
| 4,616,352 | 10/1986 | Sallas et al. | 367/190 |
| 4,637,722 | 1/1987 | Kim | 356/350 |
| 4,671,112 | 6/1987 | Kimura et al. | 73/505 |
| 4,674,331 | 6/1987 | Watson | 73/505 |
| 4,687,330 | 8/1987 | Lefevre | 356/350 |
| 4,695,160 | 9/1987 | Egli | 356/350 |
| 4,707,136 | 11/1987 | Kim | 356/350 |
| 4,728,192 | 3/1988 | Shaw et al. | 356/350 |
| 4,836,675 | 6/1989 | Hendow et al. | 356/350 |
| 4,872,754 | 10/1989 | Ensley | 356/350 |

(List continued on next page.)

*Primary Examiner*—Paul Ip
*Attorney, Agent, or Firm*—Weingarten, Schurgin, Gagnebin & Hayes LLP

[57] ABSTRACT

Electronics for use in Coriolis and other sensors for reducing errors in the sensor output signal. An off-frequency drive scheme includes a frequency translation circuit in the excitation feedback loop of a sensor system to suppress components of the sensor drive signal at a predetermined frequency so that coupling of the drive signal to the sensor output signal can be readily removed by conventional filtering techniques. An amplifier circuit having a bandpass circuit in cascade with the forward loop gain is provided, with the bandpass circuit having a transfer function approximating one plus a bandpass characteristic, the passband of which corresponds to the information band. This arrangement increases the open-loop gain of the amplifier circuit around the information frequency without affecting the open-loop gain at DC and crossover so as to reduce phase and gain errors around the information frequency. A quadrature nulling system is provided for an in-plane micromechanical gyroscope. A signal having an in-phase component due to Coriolis induced out-of-plane motion and a quadrature component due to mechanical misalignments is mixed with a voltage in-phase with motor position. The mixer output is used to apply a DC potential to motor drive electrodes and is automatically adjusted by the integral compensator until the mixer output is zero, resulting in a nulled quadrature component.

6 Claims, 15 Drawing Sheets

U.S. PATENT DOCUMENTS

| | | | |
|---|---|---|---|
| 4,884,446 | 12/1989 | Ljung | 73/505 |
| 4,915,503 | 4/1990 | Pavlath | 356/350 |
| 4,930,351 | 6/1990 | Macy et al. | 73/505 |
| 4,960,319 | 10/1990 | Dankowych | 350/96.29 |
| 4,967,123 | 10/1990 | Lebsock | 318/490 |
| 5,018,860 | 5/1991 | Bielas et al. | 356/350 |
| 5,055,759 | 10/1991 | Miyahara | 318/651 |
| 5,094,537 | 3/1992 | Karpinski, Jr. | 356/350 |
| 5,138,883 | 8/1992 | Paquet et al. | 73/504 |
| 5,148,236 | 9/1992 | Blake et al. | 356/350 |
| 5,155,422 | 10/1992 | Sidman et al. | 318/560 |
| 5,182,611 | 1/1993 | Bielas et al. | 356/350 |
| 5,187,664 | 2/1993 | Yardley et al. | 364/424.02 |
| 5,205,171 | 4/1993 | O'Brien et al. | 73/517 B |
| 5,233,351 | 8/1993 | Gregory et al. | 342/100 |
| 5,241,861 | 9/1993 | Hulsing, II | 73/505 |
| 5,245,347 | 9/1993 | Bonta et al. | 342/149 |
| 5,272,922 | 12/1993 | Watson | 73/505 |
| 5,285,686 | 2/1994 | Peters | 73/505 |
| 5,343,398 | 8/1994 | Goodzeit et al. | 364/434 |
| 5,371,451 | 12/1994 | Toyosawa et al. | 318/568.13 |
| 5,388,458 | 2/1995 | Weinberg et al. | 73/505 |
| 5,392,650 | 2/1995 | O'Brien et al. | 73/517 AV |
| 5,400,269 | 3/1995 | White et al. | 364/570 |
| 5,416,584 | 5/1995 | Kay | 356/350 |
| 5,426,970 | 6/1995 | Florida et al. | 73/1 D |
| 5,442,583 | 8/1995 | Woodbury et al. | 367/135 |
| 5,444,641 | 8/1995 | White | 364/484 |
| 5,459,432 | 10/1995 | White et al. | 329/307 |
| 5,487,015 | 1/1996 | White | 364/484 |

ELECTRONICS FOR CORIOLIS FORCE AND OTHER SENSORS

This application is a division of U.S. patent application Ser. No. 08/219,023, filed Mar. 28, 1994, now U.S. Pat. No. 5,481,914.

FIELD OF THE INVENTION

This invention relates generally to sensor systems and more particularly, to Coriolis force sensors utilizing electronics for reducing sensor output errors due to drive signal coupling to the output, quadrature, and phase shift.

BACKGROUND OF THE INVENTION

Coriolis force sensors, such as gyroscopes for sensing rotational rate, are known. Generally, such sensors include a proof mass coupled to a support by flexures and vibrated in an oscillatory manner in-plane at a predetermined frequency. More particularly, a drive electrode electrostatically couples a drive, or excitation, signal to the proof mass to impart such vibration. The vibrating proof mass is responsive to an inertial input, such as a rotational rate, for deflecting out of the plane of vibration as a result of Coriolis forces induced by the inertial input.

An output sense electrode permits sensing of the out-of-plane deflection of the proof mass for further processing to provide a sensor output signal indicative of the inertial input. Generally, an additional sense electrode is provided for sensing the in-plane displacement of the proof mass caused by the vibration. The in-plane sense signal is coupled to a feedback gain control circuit for controlling the amplitude of the drive signal.

As is known in the art of Coriolis force sensors, in order to achieve an acceptable response from the sensor, the in-plane proof mass vibration has a frequency at, or close to, the resonant frequency of the proof mass. To this end, the drive signal has a frequency equal to the resonant frequency of the proof mass. However, parasitic capacitances between the drive electrode and the sense electrodes can cause significant errors. That is, when the drive signal capacitively couples into the in-plane sense electrode, the accuracy of amplitude control by the feedback circuit is degraded resulting in less than optimum sensor performance. Moreover, when the drive signal is capacitively coupled to the out-of-plane sense electrode, the resulting sensor output signal will be contaminated and will not be an accurate indication of the Coriolis forces induced by the inertial input.

Unfortunately, the motion of the proof mass, or motor, established in the absence of rotation is not completely in-plane. A small but not insignificant out-of-plane motion component, due to mechanical rotation of the suspension beam's principal area moments of inertia and other misalignments, is in time quadrature with the Coriolis motion. This undesired component is typically referred to as "quadrature" and degrades system performance by limiting AC gain in front of a baseband modulator, thus deteriorating the overall DC performance of the system. This is extremely undesirable since the out-of-plane motion is often very small for angular rates of typical interest. Thus, a low sensor gain puts a severe burden on detection electronics in terms of noise and drift. Moreover, the quadrature term of the sensor output signal is multiplied by any phase error introduced by the electronics used to process the sensor output signal, thereby causing the quadrature term to couple into the output.

It has been proposed to minimize unwanted quadrature signals by providing highly accurate phase response in the compensating circuitry. Specifically, a demodulation reference would have to be exactly in-phase with the rate-dependent, in-phase signal. Even if this approach is assumed practicable, it would necessitate the use of undesirably complex and expensive additional circuitry. Thus, a simple means for eliminating the effect of quadrature is desired.

Various techniques are utilized generally in an effort to reduce closed-loop phase error, or drift, in servo circuits, such as amplifier circuits utilizing an operational amplifier. One such technique includes the addition of one or more zeros (i.e., a lead filter) in cascade with the open-loop gain of the operational amplifier in order to flatten the open-loop gain over a portion of the frequency band, generally resulting in only moderate closed-loop error reduction and also compromising stability. Another technique for reducing gain and phase errors is to increase the gain-bandwidth product associated with the operational amplifier. However, use of this technique is limited by the gain-bandwidth product of commercially available operational amplifiers as well as by the acceptable increased power dissipation associated with higher performance operational amplifiers.

In a typical micromechanical in-plane gyroscope, a servo system is employed to establish sinusoidal in-plane proof-mass motion of fixed amplitude. Application of an inertial rate about an axis in-plane and orthogonal to the direction of in-plane motion of the proof-masses generates an out-of-plane force also known as a Coriolis force. This out-of-plane force is proportional to the in-plane motor velocity and the inertial rate, and excites out-of-plane motion at the same frequency as the in-plane motion. The amplitude of the Coriolis-induced out-of-plane motion is thus proportional to the input inertial rate. Accordingly, in order to achieve an indication of inertial rate, it is desired to sense that component of the out-of-plane motion which is in-phase with the motor velocity.

SUMMARY OF THE INVENTION

In accordance with the invention, a sensor is provided with electronics for reducing errors in the sensor output. The electronics includes an off-frequency drive scheme for reducing in-band coupling of the drive signal to the output signal, a technique for reducing phase errors and a quadrature nulling circuit. In one embodiment, a tuning fork gyroscope utilizes the off-frequency drive scheme to reduce in-band drive signal coupling and one of the phase error reduction and quadrature nulling techniques to reduce the term of the sensor output signal related to the product of quadrature and phase error.

Off-Frequency Drive

A sensor system includes a frequency translation circuit disposed in feedback relationship between an output transducer and an input transducer for suppressing a component of a feedback signal at a predetermined frequency to provide a drive signal to the input transducer. The input transducer has a nonlinear characteristic for converting the drive signal into a force signal to drive the sensor. In response to the force signal and an external stimulus, the sensor provides a signal indicative of the effect of the force signal on the sensor and a signal indicative of the effect of the stimulus on the sensor. A first output transducer processes the force effect signal to provide the feedback signal to the frequency translation circuit. A second output transducer processes the external stimulus indicative signal to provide a sensor output signal having the predetermined frequency.

This arrangement provides an off-frequency excitation scheme for eliminating in-band coupling of the drive signal to the sensor output signal (i.e., coupling of a drive signal having a frequency component coinciding with the frequency of the sensor output signal). More particularly, since the drive signal has no energy at the predetermined frequency of the sensor output signal, contamination of such output signal by the drive signal is readily removable with conventional filtering techniques without a loss of desired information. Thus, the disadvantageous effect of drive signal coupling into the sensor output signal is avoided.

In one embodiment, the sensor is a Coriolis force sensor having a proof mass responsive to Coriolis forces induced by an inertial input. More particularly, the proof mass is adapted for being vibrated in a plane at its resonant frequency and is responsive to an inertial input for deflecting out of the plane of vibration at the resonant frequency and with a magnitude corresponding to the inertial input. The sensor includes at least two sense electrodes; one for sensing displacement of the proof mass caused by the in-plane vibration to provide an-in-plane sense signal and one for sensing the out-of-plane deflection of the proof mass caused by the inertial input to provide an inertial sense signal.

An electrostatic actuator comprising a drive electrode provides the nonlinear input transducer. The drive electrode converts the drive signal into a force signal to vibrate the proof mash at the resonant frequency. The Coriolis force sensor has two output transducers, both comprising charge amplifiers. A first one of the charge amplifiers converts the in-plane sense signal into a voltage feedback signal indicative of the amplitude and frequency of the force on the proof mass and a second one of the charge amplifiers converts the inertial sense signal into a sensor output signal indicative of the inertial input.

A frequency translation circuit receives the feedback signal and suppresses a component thereof at the resonant frequency of the proof mass to provide the drive signal with no energy at the resonant frequency. Stated differently, the frequency translation circuit shifts the frequency of the feedback signal to provide the drive signal having a frequency separated from, or non-coincident with, the resonant frequency. Since the force signal is nonlinear with respect to the drive signal, and specifically has a square-law relationship therewith, the force signal is provided with a component at the resonant frequency to drive the proof mass even though the drive signal has no energy at the resonant frequency.

With this arrangement, capacitive coupling of the drive signal to the sensor output signal results in readily removable components in the sensor output signal. That is, since the drive signal has a frequency spaced from the resonant frequency of the sensor and, likewise, spaced from the frequency of the sensor output signal, conventional filtering techniques on the sensor output signal readily remove coupled drive signal components therefrom. Thus, the sensor output signal is a more accurate indication of the Coriolis forces induced by an inertial input on the sensor.

In one embodiment, the frequency translation circuit includes a phase shifter for shifting the phase of the feedback signal and a commutator for multiplying the phase-shifted signal by a commutation signal having a commutation frequency to provide the drive signal. Multiplication of the phase-shifted signal by the commutation signal shifts the frequency of the phase-shifted signal away from the resonant frequency. Also provided is gain control circuitry for rectifying the phase-shifted signal and comparing the rectified signal to a reference voltage to provide a DC bias signal for controlling the amplitude of the force at the resonant frequency. A summing circuit adds the phase-shifted signal and the DC bias signal to provide the phase-shifted input signal to the commutator. A limiter circuit may be utilized for converting the sinusoidal feedback signal into a square-wave signal for processing by the frequency translation circuit.

In an alternate embodiment, the frequency translation circuit includes a multiplier for multiplying the feedback signal by a sinusoidal carrier signal. A summing circuit is provided for adding the sinusoidal carrier signal to the sideband signal to provide the drive signal.

Phase-Corrected Amplifier Circuit

An amplifier circuit is provided with reduced phase and gain errors in processing narrowband information. The amplifier circuit includes a first operational amplifier in cascade with a bandpass circuit, the passband of which corresponds to the information band. A global feedback network is provided around the operational amplifier and the bandpass circuit. With this arrangement, the amplifier circuit is provided with increased open-loop gain around the information frequency which reduces gain and phase errors associated with conventional amplifiers. Preferably, the amplifier circuit provides such open-loop gain boost without requiring additional compensation circuitry.

In one embodiment, the bandpass circuit has a transfer function approximating one plus a bandpass characteristic and effectively provides two parallel signal paths in the open-loop system, one with unity gain and one with a frequency dependent gain. The unity gain signal path dominates at frequency extremes, so that the first operational amplifier governs the gain of the composite amplifier circuit at such frequencies. The frequency dependent gain signal path has a maximum gain at the information frequency to significantly boost the open-loop gain of the composite amplifier circuit at the information frequency. Thus, at DC and at frequencies somewhat higher than the information frequency, including at crossover, the bandpass-circuit has negligible effect on the open-loop gain of the amplifier circuit, thereby minimizing the effect of the bandpass circuit on servo stability. In the vicinity of the information frequency however, the bandpass circuit boosts the open-loop gain of the amplifier circuit to significantly reduce gain and phase errors, by a factor approximating one plus the bandpass characteristic.

A bandpass circuit approximating the one plus bandpass characteristic is described and includes a second operational amplifier having a non-inverting input driven by the output of the first operational amplifier and an output providing an output terminal of the amplifier circuit. The global feedback network is coupled between the output of the second operational amplifier and an input of the first operational amplifier. A local feedback network is coupled between the output of the second operational amplifier and an inverting input thereof to provide the one plus bandpass transfer function without requiring additional compensation circuitry to ensure circuit stability.

The amplifier circuit is well suited for use in the sense electronics of a Coriolis force sensor, such as a gyroscope, or other sensors in which the sensor output is accompanied by a quadrature error signal, or wherever accurate gain and phase are required. In one embodiment, a tuning fork gyroscope is provided having a pair of proof masses adapted for being vibrated in a first plane at a predetermined frequency. The proof masses are responsive to an input rotational rate about an in-plane input axis for deflecting out-of-plane about an output axis. A pair of sense electrodes is provided for sensing the out-of-plane deflection of the proof masses to provide a sensor output signal. A phase-corrected amplifier circuit of the type described above processes the sensor output signal to provide a signal proportional to the input rotational rate. With this arrangement, the phase-corrected amplifier circuit reduces phase error, thereby reducing quadrature contamination of the sensor output signal.

Quadrature Nulling

An automatic and continuous quadrature nulling system for an in-plane micromechanical gyroscope is disclosed. Sense outputs, either from suspended proof masses or from underlying sense electrodes, comprise a charge variation representative of capacitance variation developed between the proof masses and a central motor or in-plane sensor, and between the proof masses and underlying, out-of-plane biasing electrodes. This charge passes through a charge amplifier which converts the signal into a voltage reflective of the capacitance variation. The amplified output of the charge amplifier, having an in-phase component due to the Coriolis induced out-of-plane motion and a quadrature component ninety degrees out of phase with respect to the drive voltage due to mechanical asymmetry is mixed with a voltage in-phase with motor position. The mixer output is essentially equivalent to the product of the magnitudes of the in-phase voltage and the quadrature component. This output passes through an integral compensator forming a DC offset component of a second drive signal applied to the motor drive electrodes. The DC potential generates a proportional charge in-phase with motor position, and in quadrature with Coriolis out-of-plane motion. The DC potential on the motor drive electrodes is automatically adjusted by the integral compensator until the mixer output is zero, resulting in a nulled quadrature component.

BRIEF DESCRIPTION OF THE DRAWINGS

The foregoing features of this invention, as well as the invention itself, may be more fully understood from the following detailed description of the invention in which.

DESCRIPTION OF THE PREFERRED EMBODIMENT

A sensor is provided with electronics for reducing errors in the sensor output signal. The electronics includes an off-frequency drive scheme as shown and discussed in conjunction with FIGS. 1-5 for reducing in-band coupling of the drive signal to the output signal. Further improvements include techniques for reducing output signal errors due to the effect of quadrature and phase errors. One such technique comprises the use of phase-corrected amplifiers in the sensor processing electronics for reducing phase errors as shown and described in conjunction with FIGS. 6-12 and another such technique comprises a quadrature nulling circuit as shown and described in conjunction with FIGS. 13-16.

In one embodiment, a sensor utilizes the off-frequency drive scheme in conjunction with one of the phase-corrected amplifiers and the quadrature nulling circuit due to the multiplicative effect of quadrature and phase error as an error term of the sensor output signal (i.e., since a reduction in either the phase error or the quadrature reduces the error term). While both the phase-corrected amplifiers and the quadrature nulling circuit may be utilized together in the same sensor, their combined use may be somewhat superfluous. It will be appreciated however that each of the sensor electronics improvements described herein may be utilized independently in a sensor or other servo system or alternatively, may be utilized in various combinations depending on the demands of a particular application.

Off-Frequency Drive

Figure 1:
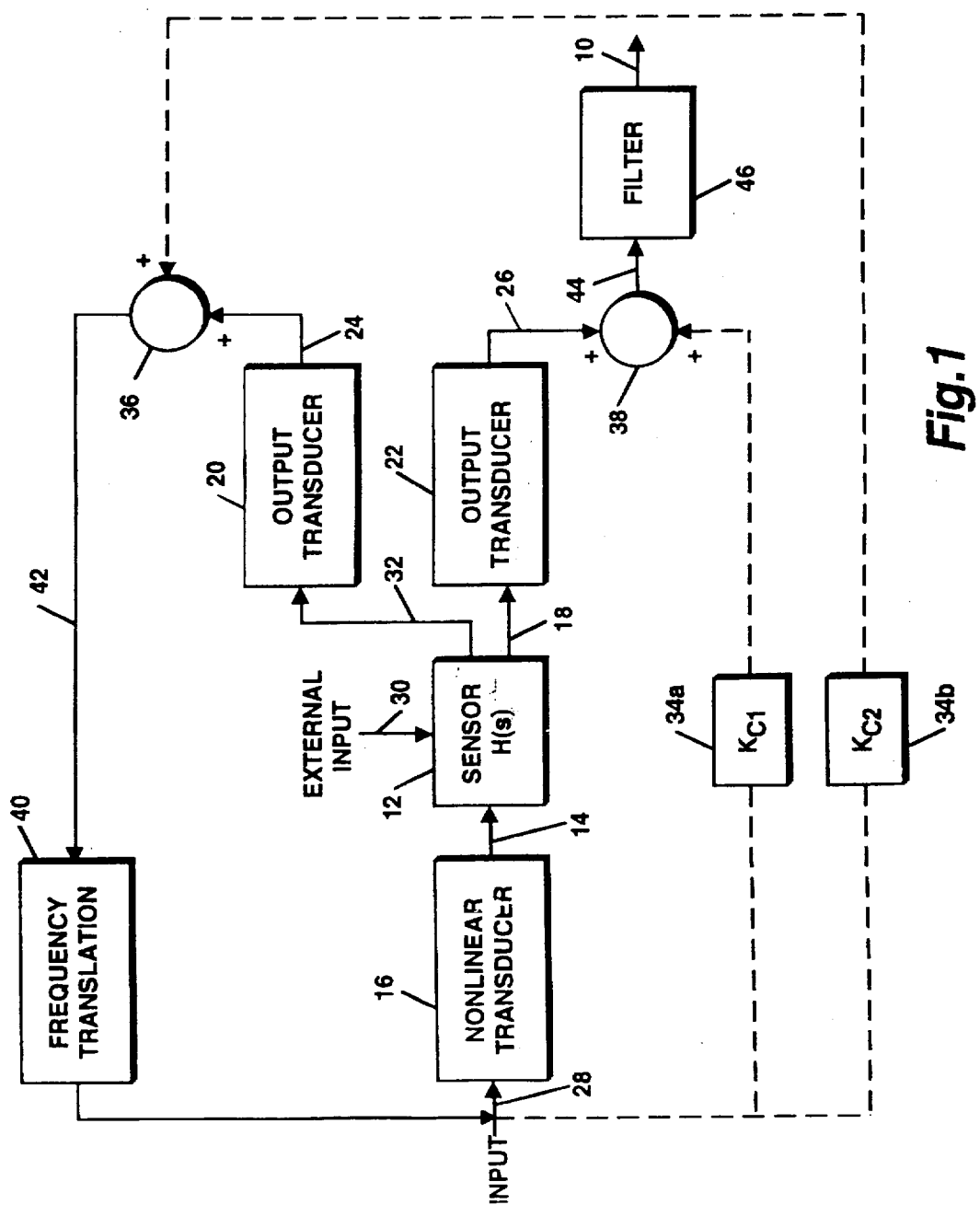
FIG. 1 is a block diagram of the off-frequency drive scheme of the present invention.

Referring to FIG. 1, a sensor system is shown to include a sensor 12 having a frequency translation circuit 40 in feedback relationship therewith. The sensor 12 is responsive to a force (i.e., represented by force signal 14) and an external input, or stimulus 30 for providing output signals 32, 18 to corresponding output transducers 20, 22, respectively. Output signal 32 is indicative of the force applied to the sensor 12 by the force signal 14 and output signal 18 is indicative of the external stimulus 30 to the sensor 12. Various types of sensors are suitable for use in the system of FIG. 1, such as the Coriolis force sensors of FIGS. 2 and 5. In general however, the system of FIG. 1 is advantageous for use in sensor systems having a nonlinear input transducer where accurate sensing of an external stimulus is desired, as will become apparent.

The output transducer 20 converts the force indicative signal 32 into a feedback signal 24 which is further processed to control the force signal 14 in a close-loop manner. Similarly, the output transducer 22 converts the external stimulus indicative signal 18 into a sensor output signal 26. Where the sensor 12 is a Coriolis force sensor, the output signals 18, 32 are charge variation signals, or currents, and the output transducers 20, 22 are charge amplifiers which convert the charge signals 18, 32 into corresponding voltage signals 24, 26, as discussed below in conjunction with FIG. 2.

The sensor system further includes a nonlinear input transducer 16 which converts a drive signal 28 into the force signal 14 for driving the sensor 12. In the case of a Coriolis force sensor, the nonlinear input transducer 16 may comprise a drive electrode in electrostatic communication with the proof mass of the sensor 12.

Ideally, the feedback signal 24 and the sensor output signal 26 are accurate indications of the force signal 14 and the external stimulus 30, respectively. However, the sensor system is susceptible to a capacitive coupling effect caused by parasitic capacitances related to the fabrication and packaging of the sensor system. More particularly, a coupling path exists between the drive signal 28 and each of the feedback and sensor output signals 24, 26, as shown by the dotted lines, and has coupling coefficients 34a, 34b associated therewith. The respective coupling results in the product of the respective coupling coefficient and the drive signal being summed with the signals 24, 26, as indicated diagrammatically by summing nodes 36, 38, thereby contaminating the feedback signal 24 and the sensor output signal 26. In conventional sensor systems in which the drive signal has the same frequency as the feedback signal and the sensor output signal (i.e., resulting in-band coupling), the contamination resulting from the coupling effect is impossible to remove if the coupled signal is at the same frequency as the desired information.

The frequency translation circuit 40 eliminates in-band coupling of the drive signal 28 to the output signals 24, 26 (i.e., coupling of a drive signal having the same frequency as the information signals 24, 26) by multiplying the feedback signal by a commutation signal to suppress the component of the feedback signal 24 at the predetermined frequency of the sensor output signal 26. For example, in the case of a Coriolis force sensor, the output signals 24, 26 have a frequency corresponding to the resonant frequency of the sensor 12 so that the frequency translation circuit 40 suppresses components of the feedback signal at the resonant frequency of the sensor.

The output of the frequency translation circuit 40 provides the drive signal 28 which is coupled to the nonlinear input transducer 16, as shown. The nonlinearity of the transducer 16 enables conversion of the drive signal 28, which lacks energy at the predetermined frequency, to be converted into a force which has a significant component at such frequency in order to drive the sensor 12. Any coupling of the drive signal 28 to the sensor output signal 26 may then be readily removed by conventional filtering techniques, such as filter 46, since the drive signal 28 has a frequency which is non-coincident with the frequency of the sensor output signal 26. With this arrangement, the filtered sensor output signal 10 is an accurate measure of the external stimulus 30.

Figure 2:
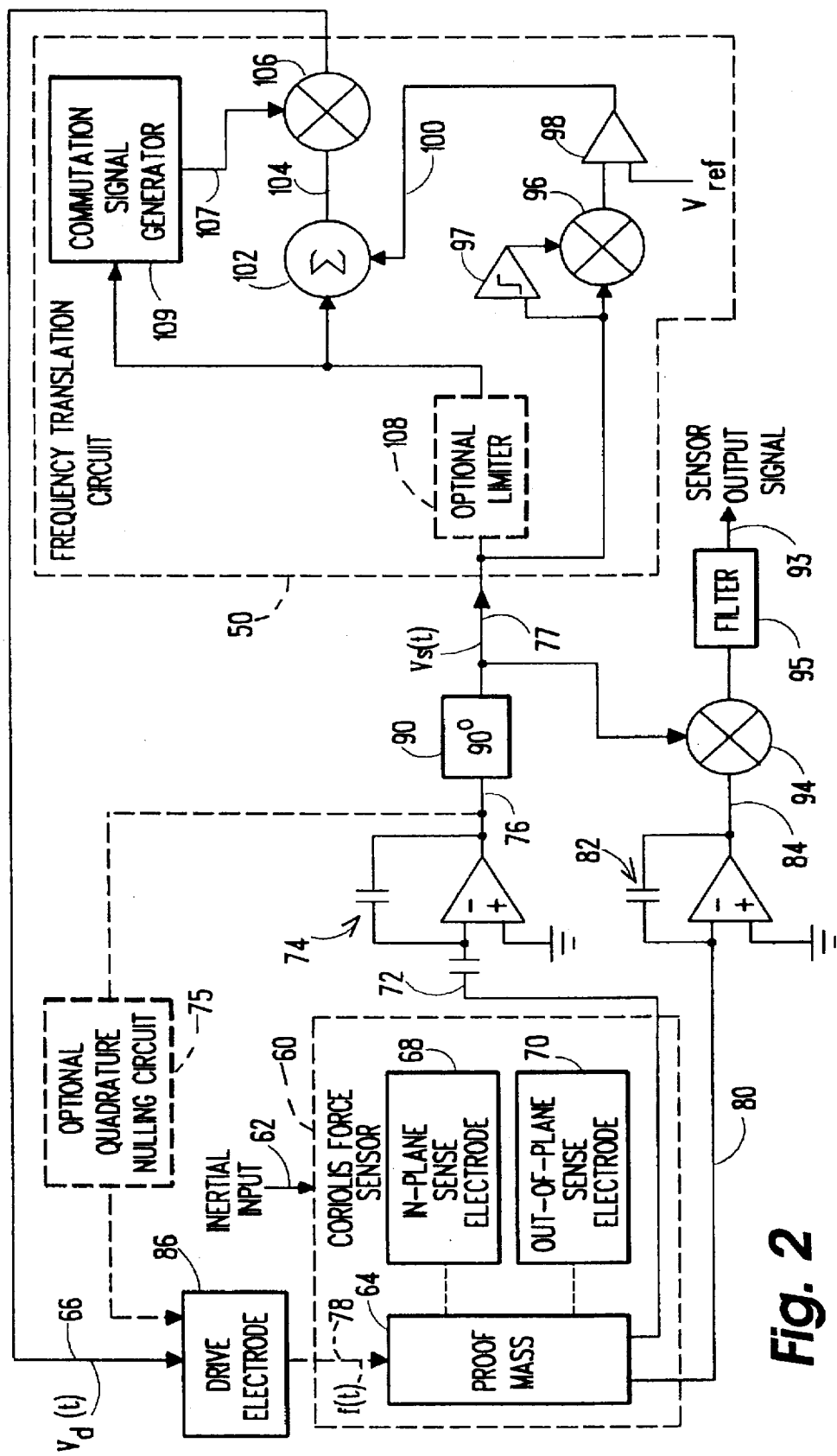
FIG. 2 is a diagram of a Coriolis force sensor and processing electronics including a frequency translation circuit utilizing the off-frequency drive scheme of FIG. 1.

Referring to FIG. 2, one embodiment 50 of the frequency translation circuit is shown in use in conjunction with a Coriolis force sensor 60. Illustrative examples of Coriolis force sensors are gyroscopes in which the external stimulus 62 is an inertial input 62 comprising rotational rate. The sensor 60 includes a proof mass 64 adapted for being vibrated in a plane in an oscillatory manner in response to a force (i.e., represented by a force signal 78) having a frequency component at or near the resonant frequency of the proof mass. The in-plane vibration of the proof mass 64 provides linear momentum so that when the sensor 60 is subjected to the inertial input 62, the proof mass 64 deflects out of the plane of vibration about an output axis at a frequency corresponding to the frequency of the force signal 78 (i.e., the resonant frequency of the proof mass) and an amplitude corresponding to the inertial input 62.

A drive electrode 86, in electrostatic communication with the proof mass 64, applies the drive signal 66 to the proof mass 64 and thus, may be referred to as an electrostatic actuator. More particularly, the drive electrode 86 converts the drive signal 66 into a force signal 78 having a nonlinear relationship with respect to the drive signal 66. Specifically, the force signal 78 has a square-law relationship with respect to the drive signal 66.

A pair of sense electrodes 68, 70 are provided to detect the in-plane displacement of the proof mass 64 in response to the force signal 78 and the out-of-plane deflection of the proof mass 64 in response to the inertial input 62, respectively. More particularly, each of the sense electrodes 68, 70 has a DC or carrier excitation signal applied thereto (not shown) to induce a charge in the proof mass 64 proportional to the varying capacitance between the respective sense electrode and the proof mass 64. Thus, the sense, or pickoff of the charge variation signals is from the proof mass 64, as shown. An in-plane sense signal 72 is coupled to a charge amplifier 74 for conversion to a voltage feedback signal 76 which is indicative of the force causing the in-plane vibration of the proof mass 64. An inertial sense signal 80 is coupled to a charge amplifier 82 which converts the charge signal 80 into an inertial output signal 84 which is indicative of the inertial input 62. The inertial output signal 84 is further processed by a demodulator 94 which receives a phase-shifted signal 77 after processing by a ninety-degree phase shifter 90, as shown. The signal 77 has the same frequency but is ninety-degrees out of phase with respect to the inertial output signal 84 so that the output of the demodulator 94 is a DC signal proportional to the inertial input 62 and a cosine signal having an amplitude proportional to the inertial input 62 and a frequency equal to approximately twice the resonant frequency. A low pass filter 95 filters the demodulated signal to provide the sensor output signal 93 which is proportional to the inertial input 62.

Coupling of the drive signal 66 to the charge amplifier output signals 76 and 84 often results from parasitic capacitances in the fabrication and packaging of the sensor system. In conventional systems in which the drive signal 66 has a frequency corresponding to the resonant frequency of the proof mass, and thus also corresponding to the frequency of the output signals 76, 84, the error introduced by such coupling is difficult, if-not impossible to remove without sacrificing the accuracy of the sensor output signal.

As noted above, the frequency translation circuit 50 eliminates in-band coupling (i.e., coupling of a signal having the same frequency as, or a frequency very close to, the sensor output signals). To this end, the frequency translation circuit 50 is coupled in feedback relationship between the output of the phase-shifter 90 and the drive electrode 86.

The way in which the frequency translation circuit 50 eliminates in-band coupling of the drive signal 78 is by suppressing components of the feedback signal 76 corresponding to the resonant frequency of the proof mass 64. The frequency translation circuit 50 may include an optional limiter circuit 108 in order to convert the phase shifted feedback signal 76 into a squarewave feedback signal, as will be discussed below. Where the limiter 108 is not utilized, the signal 92 can be represented as:

$$V_s(t)=A\cos\omega_r t \quad (1)$$

where A is the gain introduced by the charge amplifier 74 and $\omega_r$ is the resonant frequency of the proof mass 64. The frequency translation circuit 50 effectively shifts the frequency of the phase-shifted feedback signal 77 by multiplying the feedback signal 77 by a commutation signal 107 having a frequency $\omega_c$ which is greater or less than the resonant frequency so that the resulting drive signal 66 lacks energy at the resonant frequency. More generally however, the commutation signal is a periodic (i.e., non-DC) signal.

More particularly, in order to control the amplitude of the drive signal 66, automatic gain control circuitry is provided and includes a multiplier 96 and a comparator 97 which operate to full-wave rectify the cosine signal 92 and an integrating amplifier 98 for detecting the difference between the average value of the rectified signal and a reference voltage $V_{ref}$ to provide a DC bias signal 100 indicative of an amplitude error. A summing circuit 102 adds the phase-shifted signal 92 and the DC bias signal 100 to provide an amplitude corrected and phase-shifted signal 104, referred to hereinafter as phase-shifted bias signal 104. A commutating multiplier 106 multiplies the phase-shifted bias signal 104 by the commutation signal 107. The commutation signal 107 is provided by a commutation signal generator 109 and may be derived from the phase-shifted signal 92 in a manner described below in conjunction with FIG. 3 or alternatively, may be derived from an independent signal source. The output of the frequency translation circuit 50 provides the drive signal 66 which is coupled to the drive electrode 86 for electrostatic actuation of the proof mass 64.

The commutation signal 107 may be sinusoidal or a squarewave signal. Considering the case where the commutation signal 107 is a unit square wave $sq(\omega_c t)$ and DC is the bias signal 100, the drive signal 66 can be represented as follows:

$$V_d(t)=(DC+A\cos\omega_r t)sq(\omega_c t) \qquad (2)$$

Consideration of equation (2) reveals that, with certain restrictions on the commutation frequency $\omega_c$, the drive signal 66 contains no energy at the resonant frequency $\omega_r$ of the proof mass 64. More particularly, expansion of the drive signal of equation (2) yields a term which is proportional to the product of the DC bias 100 and the commutation signal 107 and a term which is proportional to the product of the cosine signal 92 and the commutation signal 107. The former term contains only components which are non-coincident with the resonant frequency as long as the commutation frequency $\omega_c$ is not an odd submultiple of the resonant frequency $\omega_r$. The latter term contains sidebands associated with the squarewave commutation signal 107 but shifted to center about the resonant frequency $\omega_r$, associated with the cosine signal 104. Thus, although the sidebands are centered around the resonant frequency, such sidebands are non-coincident with the resonant frequency (i.e., the latter term has a suppressed-carrier).

The nonlinearity of the electrostatic actuator, comprising the electrostatic communication between the drive electrode 86 and the proof mass 64, operates to square the drive signal 66 to provide the force 78. Thus, the resulting force signal 78 is given by:

$$f(t) = K_T\left( DC^2 + \frac{A^2}{2} + 2(DC)A\cos\omega_r t + \frac{A^2}{2}\cos 2\omega_r t \right) \qquad (3)$$

where $K_T$ is a constant related to the geometry of the electrostatic actuator. Consideration of equation (3) reveals that the force signal 78 has a large component at the resonant frequency $\omega_r$ of the proof mass 64. Components of the force signal 78 at frequencies other than the resonant frequency have a negligible effect on the vibration of the proof mass 64. That is, the proof mass is negligibly responsive to frequencies other than the resonant frequency.

As noted above, an optional limiter circuit 108 may be coupled to the output of the ninety-degree phase-shifter 90, as shown. The limiter circuit 108 converts the phase-shifted feedback signal 77 into a squarewave feedback signal 92. Thus, when the optional limiter 108 is utilized, the feedback signal 92 is given by:

$$V_s(t)=(B)sq(\omega_r t) \qquad (4)$$

where B is equal to the amplitude of the output of the limiter circuit 108. The frequency translation circuit 50 processes the squarewave signal 92 in the manner described above to provide a drive signal 66 given by:

$$V_d(t)=(DC+(B)sq(\omega_r t))sq(\omega_c t) \qquad (5)$$

The squaring effect of the electrostatic actuator results in a force signal 78 applied to the proof mass 64 as follows:

$$f(t)=K_T((DC)^2+B^2+2(DC)\ (B)sq(\omega_r t)) \qquad (6)$$

Here again, the drive signal 78 lacks frequency components at the resonant frequency but the force signal has a significant component at the resonant frequency as long as the commutation frequency $\omega_c$ is not an odd submultiple of the resonant frequency $\omega_r$. Use of the limiter circuit 108 provides higher loop-gain to ensure oscillation and permits the use of all-digital frequency translation circuitry. An optional quadrature nulling circuit 75 may be coupled between the output of the charge amplifier 74 and the drive electrode 86 as described below in conjunction with FIGS. 13–16.

Figure 3:
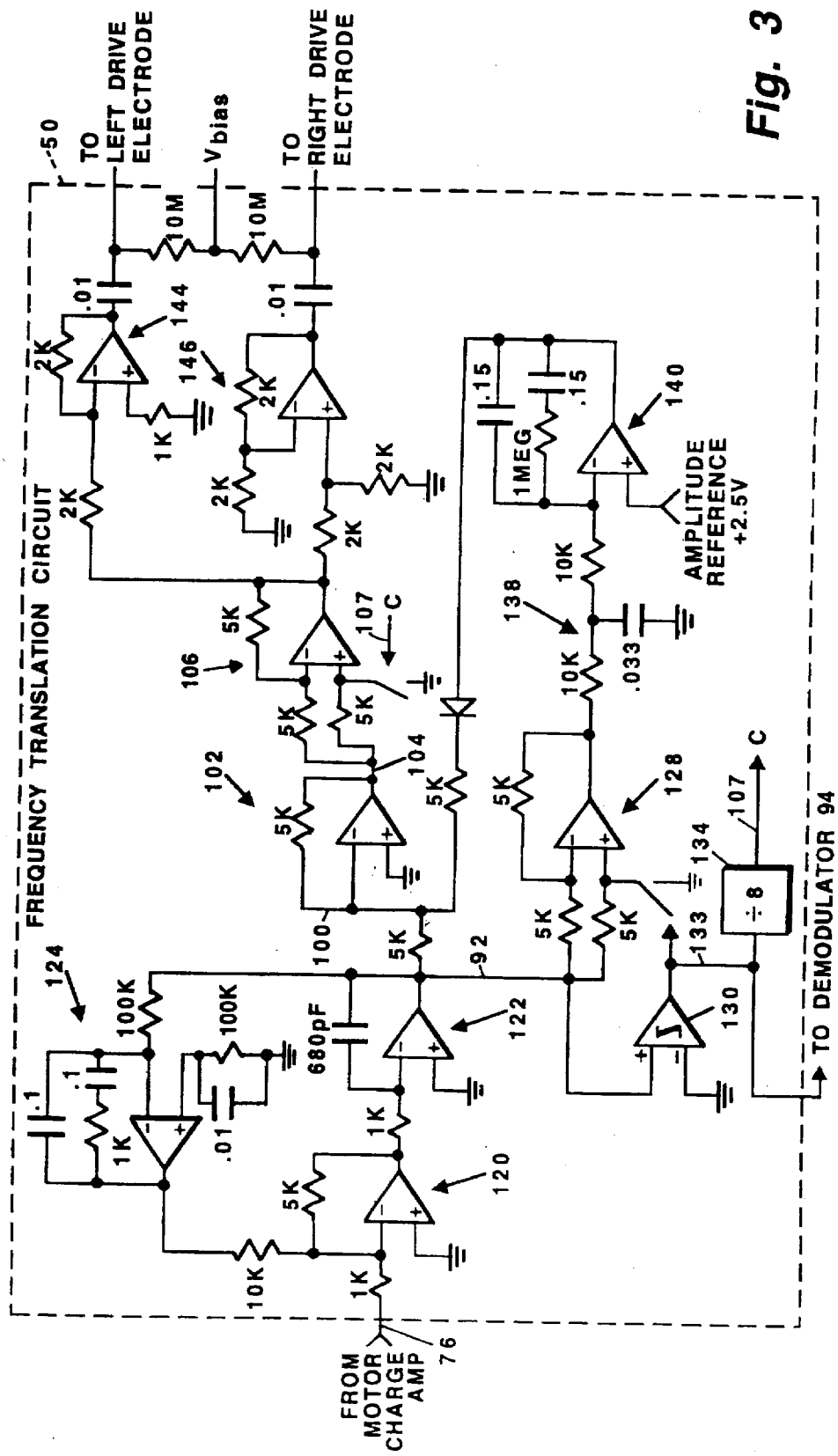
FIG. 3 is schematic of the frequency translation circuit of FIG. 2.

Referring now to FIG. 3, a schematic of the frequency translation circuit 50 of FIG. 2 is shown. The ninety-degree phase shifter 90 is here provided by an operational amplifier 122 having feedback and input impedances for integrating the output of an inverting operational amplifier 120, the input of which receives the voltage feedback signal 76 (FIG. 2). An operational amplifier 124 coupled in feedback relationship between the output of the integrating amplifier 122 and the input of the inverting amplifier 120 provides offset nulling for stabilization of the DC output of integrator 122. The phase-shifted signal 92 of the integrator 122 is coupled to a switching demodulator 128, a voltage comparator 130, and a summing amplifier 102, as shown. The phase-shifted signal 92 is further coupled to the inertial signal demodulator 94 (FIG. 2).

The voltage comparator 130 compares the phase-shifted signal 92 to a reference potential to provide a squarewave output signal 133. The squarewave comparator output signal is coupled to a frequency divider 134 which divides the resonant frequency associated with the phase-shifted signal 92 by a predetermined factor to provide the commutation signal 107 at the commutation frequency $\omega_c$. Thus, in the illustrative example where the resonant frequency is 30 KHz and the predetermined factor is eight, the commutation signal 107 has a frequency of 3.75 KHz. Note that the commutation signal 107 may be derived from the phase-shifted signal 92 in the manner described above or, alternatively, may be generated from an independent signal source within the signal generator 109 (FIG. 2) in the case of a sinusoidal commutation signal.

The switching demodulator 128, an averaging circuit 138, and an amplitude controller 140 comprise automatic gain control circuitry. The output of the switching demodulator 128 is a full-wave rectified version of the phase-shifted signal 92. The amplitude controller 140 integrates the difference between the averaged, rectified signal and a reference voltage to provide the DC bias signal 100 indicative of the difference between the measured amplitude of the drive signal and a desired amplitude. The DC bias signal 100 is added to the phase-shifted signal 92 by summing amplifier 102 to provide the phase-shifted bias signal 104.

A second switching demodulator 106 multiplies the squarewave commutation signal 107 by the phase-shifted bias signal 104. It is noted that in the case of a sinusoidal commutation signal, the commutating multiplier 106 is replaced with a linear multiplier.

Figure 5:
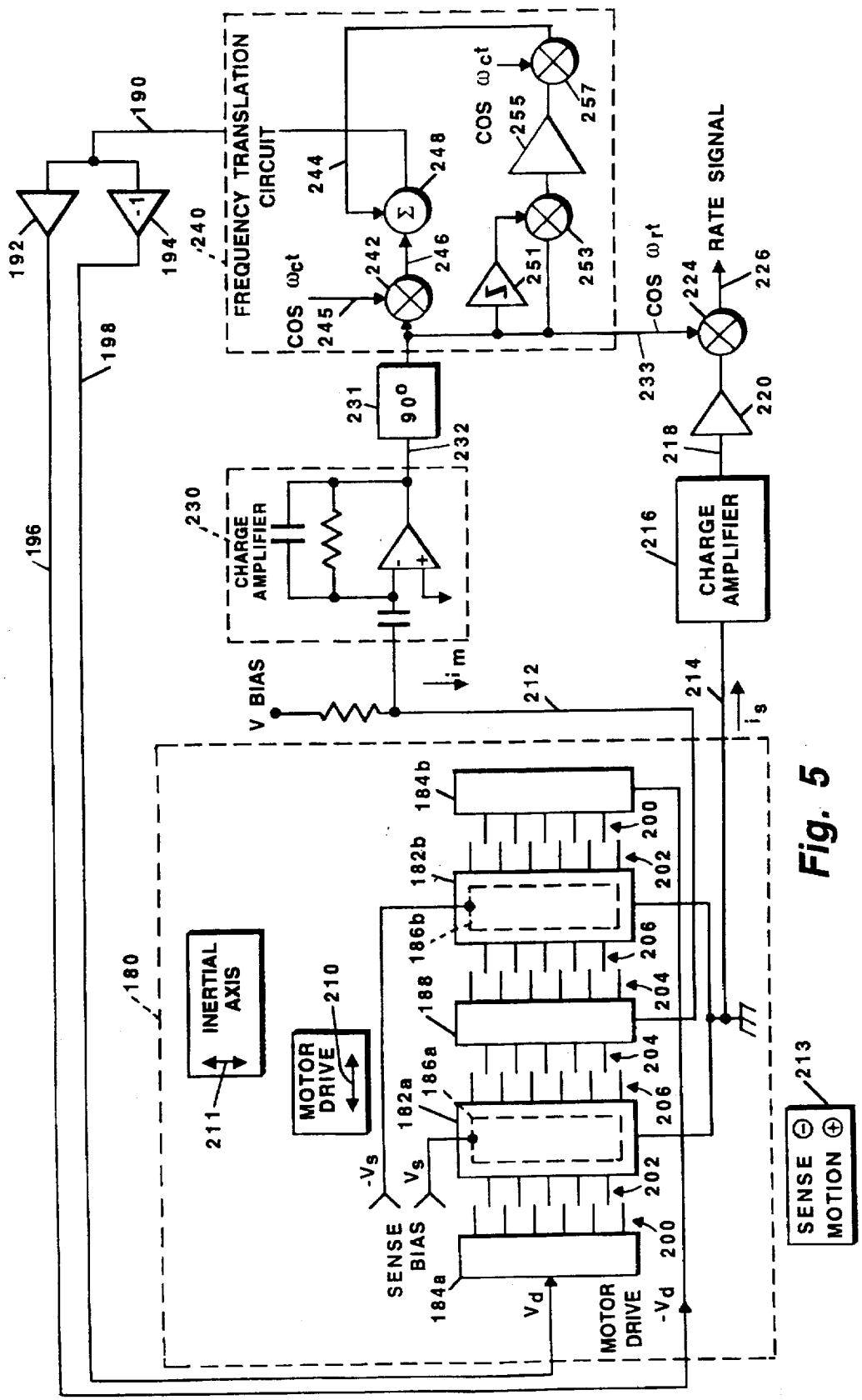
FIG. 5 is a diagram of a gyroscope and processing electronics including a further alternate embodiment of the frequency translation circuit of FIG. 1.

The output of the modulator 106 is coupled to a pair of buffer amplifiers 144, 146, one of which is inverting, to provide the drive signals to a pair of drive electrodes (see the sensor embodiment of FIG. 5). Also provided is a $V_{bias}$ signal for biasing the sense electrodes of the sensor 12 (FIG. 5). Note that for sensor systems having only a single drive electrode (FIG. 2), the output of the switching modulator 106 provides the drive signal.

Figure 4:
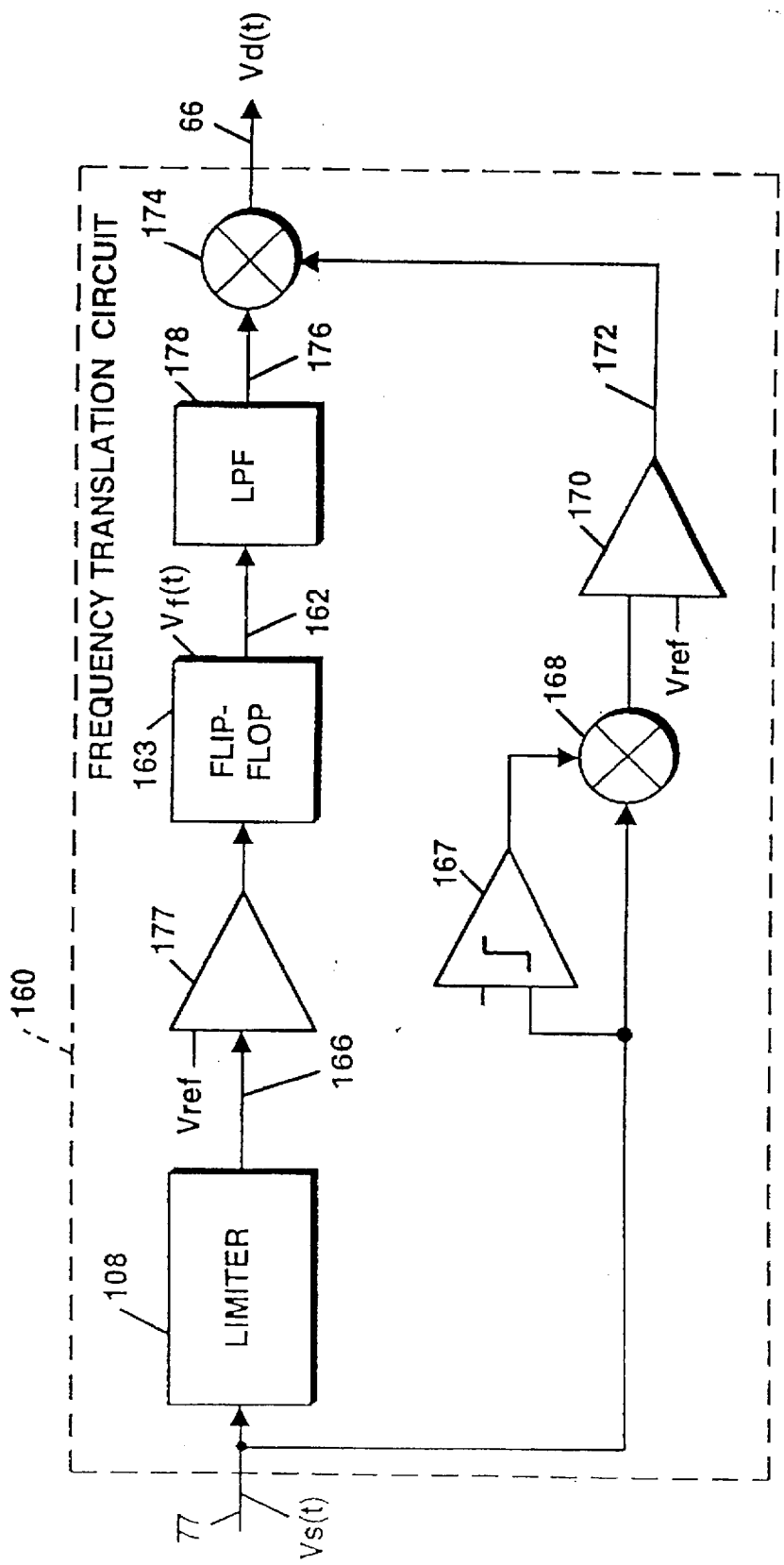
FIG. 4 is a diagram of an alternate embodiment of the frequency translation circuit of FIG. 1.

Referring to FIG. 4, an alternate embodiment 160 of the frequency translation circuit utilizes the optional limiter circuit 108 (FIG. 2) so that the feedback signal 166 is a squarewave at the resonant frequency. The translation circuit 160 provides an advantageous way of generating a drive signal 66 with a frequency equal to one-half of the resonant frequency of the proof mass in a manner that eliminates the use of a commutating multiplier (i.e., multiplier 106 of FIG. 2).

More particularly, the circuit 160 includes a comparator 177 for shifting the amplitude of the phase-shifted squarewave signal 166 to levels compatible with a flip-flop 163. The flip-flop 163 divides the frequency of the squarewave signal 166 by two to effectively commutate the squarewave signal by a rate of $\omega_r/2$. The output signal 162 (i.e., $V_f(t)$) of the flip-flop 163 is given by:

$$V_f(t) = (B) \text{sq}(\omega_r t) \text{sq}\left(\frac{\omega_r}{2} t + 90°\right) = (B) \text{sq}\left(\frac{\omega_r}{2} t\right) \quad (7)$$

Further processing of the flip-flop output signal 162 by a low pass filter 178 and the multiplication by the DC bias signal 172 by a gain control circuit 174 yields a drive signal 66 given by:

$$V_d(t) = (D) \cos\left(\frac{\omega_r}{2} t\right) \quad (8)$$

The drive signal thus provided has energy at $-\omega_r/2$ and $\omega_r/2$ and lacks energy at the resonant frequency $\omega_r$ of the proof mass. Moreover, the squaring of the drive signal by the electrostatic actuator provides the force signal with a significant component at the resonant frequency as follows:

$$f(t) = K_T \left( \frac{(D)^2}{2} + \frac{(D)^2}{2} \cos\omega_r t \right) \quad (9)$$

In a like manner to the automatic gain circuitry of the translation circuit 50 of FIG. 2, the translation circuit 160 includes a comparator 167 and a multiplier 168 which operate to full-wave rectify the cosine signal 77. An integrating amplifier 170 detects the difference between the average value of the rectified signal and a reference voltage to provide a DC bias signal 172 indicative of the required drive amplitude. A gain control circuit 174 multiplies the DC bias signal 172 by the filtered signal 176 to provide the drive signal 66.

Referring to FIG. 5, a tuning fork gyroscope sensor 180 includes a pair of proof masses 182a, b, a pair of drive electrodes 184a, b, a pair of out-of-plane sense electrodes 186a, b, and an in-plane sense electrode 188. The gyroscope 180 is a micromechanical device having a substrate above which the proof masses 182a, b and the in-plane sense electrode 188 are suspended, whereas the out-of-plane sense electrodes 186a, b are disposed on the substrate. More particularly, the proof masses 182a,b are suspended by support flexures permitting movement of the proof masses relative to the in-plane sense electrode 188, the out-of-plane sense electrodes 186a, b, and the substrate.

A drive signal 190 is coupled to a pair of buffer amplifiers 192, 194 (like buffer amplifiers 122, 146 of FIG. 3) to provide drive signals 196, 198 to the drive electrodes 184a, b, respectively, as shown. The drive electrodes 184a, b have a plurality of comb-like electrodes 200 extending therefrom and toward an adjacent one of the proof masses 182a, b. Proof masses 182a, b have comb-like electrodes 202 extending toward the adjacent one of the drive electrodes 184a, b and interleaved with the electrodes 200 of the corresponding drive electrode. With this arrangement, the electrostatic coupling of the drive signals 196, 198 to the corresponding proof masses 182a, b by the drive electrodes 184a, b imparts vibration to the proof masses in the plane of the gyroscope 180 and in the directions indicated by arrow 210 labelled motor drive. Note that at resonance, the proof mass displacement lags the drive force by ninety-degrees.

The in-plane sense electrode 188 is disposed between the two proof masses 182a, b and has comb-like electrodes 204 extending from opposite sides thereof toward the adjacent one of the proof masses. Each of the proof masses has like electrodes 206 extending toward the in-plane sense electrode 188 and interleaved with the electrodes 204 of the in-plane sense electrode 188, as shown. A bias signal $V_{bias}$ is coupled to the in-plane sense electrode 188 to enable detection of charge variations caused by displacement of the proof masses 182a, b in the plane of vibration.

In response to an inertial input, and specifically to a rotational rate about an input axis coplanar to the plane of vibration (labelled inertial axis 211), the proof masses 182a, b deflect out of the plane of vibration (i.e., about an output axis orthogonal to the input axis as labelled sense motion 213). Such out-of-plane deflection of the proof masses 182a, b occurs at a frequency corresponding to the resonant frequency of the proof masses and with an amplitude, or magnitude, corresponding to the input rotational rate. Thus, detection of the out-of-plane deflection of the proof masses 182a, b provides a measure of the rotational rate.

The out-of-plane sense electrodes 186a, b receive a DC voltage $V_S$–$V_S$ (labelled sense bias) for establishing a potential difference so that a change in the capacitance between the electrodes 186a, b and the adjacent proof masses 182a, b results in a change in charge on the proof masses 182a, b. An output signal 214 from the proof masses is thus a charge signal indicative of the out-of-plane deflection thereof.

The inertial sense signal 214 is coupled to a charge amplifier 216 for conversion of the charge signal 214 into an inertial voltage signal 218. The voltage signal 218 may be amplified by an amplifier circuit 220. Likewise, the in-plane sense signal 212 is coupled to a charge amplifier 230 for conversion to a voltage feedback signal 232. Preferably, the charge amplifier 216, the gain stage amplifier 220, and the charge amplifier 230, and possibly the ninety-degree phase-shifter 231 utilize the phase correction technique described below in conjunction with FIGS. 6–12. The output of the charge amplifier 230 is coupled to a ninety-degree phase-shifter 231 for adding ninety-degrees to the minus ninety-degrees of the proof masses, or motor at resonance to result in positive feedback. A demodulator 224 demodulates the inertial output signal by multiplying such signal by a cosine signal at the resonant frequency of the proof masses to provide a rate signal 226 indicative of the input rotational rate to which the sensor 180 is subjected. A frequency translation circuit 240 is provided for suppressing the component of the phase-shifted signal 233 at the resonant frequency $\omega_r$ of the proof masses 182a, b. To this end, the frequency translation circuit 240 includes a linear multiplier 242 for multiplying the phase-shifted signal 232 by a carrier signal 245 having a frequency $\omega_c$ spaced from the resonant frequency $\omega_r$ of the proof masses 182a, b and given by $\cos\omega_c t$. The resulting product signal 246 has sidebands at frequencies $\omega_r+\omega_c$ and $\omega_r-\omega_c$, and thus may be referred to as a double sideband signal 246. Automatic gain control circuitry is provided and includes a comparator 251, a multiplier 253, an integrating amplifier 255, and a multiplier 257. The output of the amplifier 255 is a DC bias signal (like signal 100 of FIG. 2) indicative of the difference between the measured in-plane proof mass displacement and a desired displacement. Multiplier 257 multiplies the DC bias signal by a carrier signal $\cos\omega_c t$ to provide an amplitude control signal $B\cos\omega_c t$. The amplitude control signal 244 $B\cos\omega_c t$ is added to the double sideband signal 246 by a summing circuit 248 to provide the drive signal 190 which, in addition to having components at the sideband frequencies specified above, has a component at the carrier frequency $\omega_c$, but does not have any energy at the resonant frequency, as is desired. The drive signal 190 can thus be represented as follows:

$$V_d(t) = A\cos\omega_r t \cos\omega_c t + B\cos\omega_c t \quad (10)$$

$$= \frac{A}{2}\cos(\omega_r - \omega_c)t + \frac{A}{2}\cos(\omega_r + \omega_c)t + B\cos\omega_c t$$

The squaring effect provided by the electrostatic actuator yields a force signal at the resonant frequency $\omega_r$ on the proof masses 186a, b as follows:

$$f(t) = K_T A B \cos\omega_r t \quad (11)$$

While this component of the force signal is at the resonant frequency of the proof masses, the drive signal has no energy at the resonant frequency, thereby driving the proof masses in a manner which prevents in-band coupling of the drive signal to the sensor output signal.

Various schemes can be used for generating the commutation signal 244. For example, the commutation signal can be asynchronous with respect to the in-plane sense signal or, alternatively, may be synchronized with the sense signal by using a phase-locked loop (i.e., for commutation frequencies greater than the resonant frequency of the proof masses 182a, b) or a counter (i.e., for commutation frequencies less than the resonant frequency of the proof masses 182a, b), or by other suitable means.

With the above described off-frequency sensor excitation scheme achieved by the frequency translation circuits of FIGS. 1–5, in-band coupling of the drive signal to the sensor output signals, often caused by parasitic capacitances, is eliminated. This advantageous result is achieved by shifting, or translating the frequency of the drive signal away from the resonant frequency of the proof masses while still driving the proof masses in a vibratory manner with a force signal that has a significant component at the resonant frequency. This technique is permitted by the nonlinearity of the electrostatic actuator. Thus, although the drive signal still couples to the sensor output signal, the contamination caused thereby can be readily removed by conventional filtering techniques since the contamination frequency is spaced from the resonant frequency of the proof masses and thus, also the information frequency of the sensor output signal.

Phase-Corrected Amplifier Circuit

Figure 6:
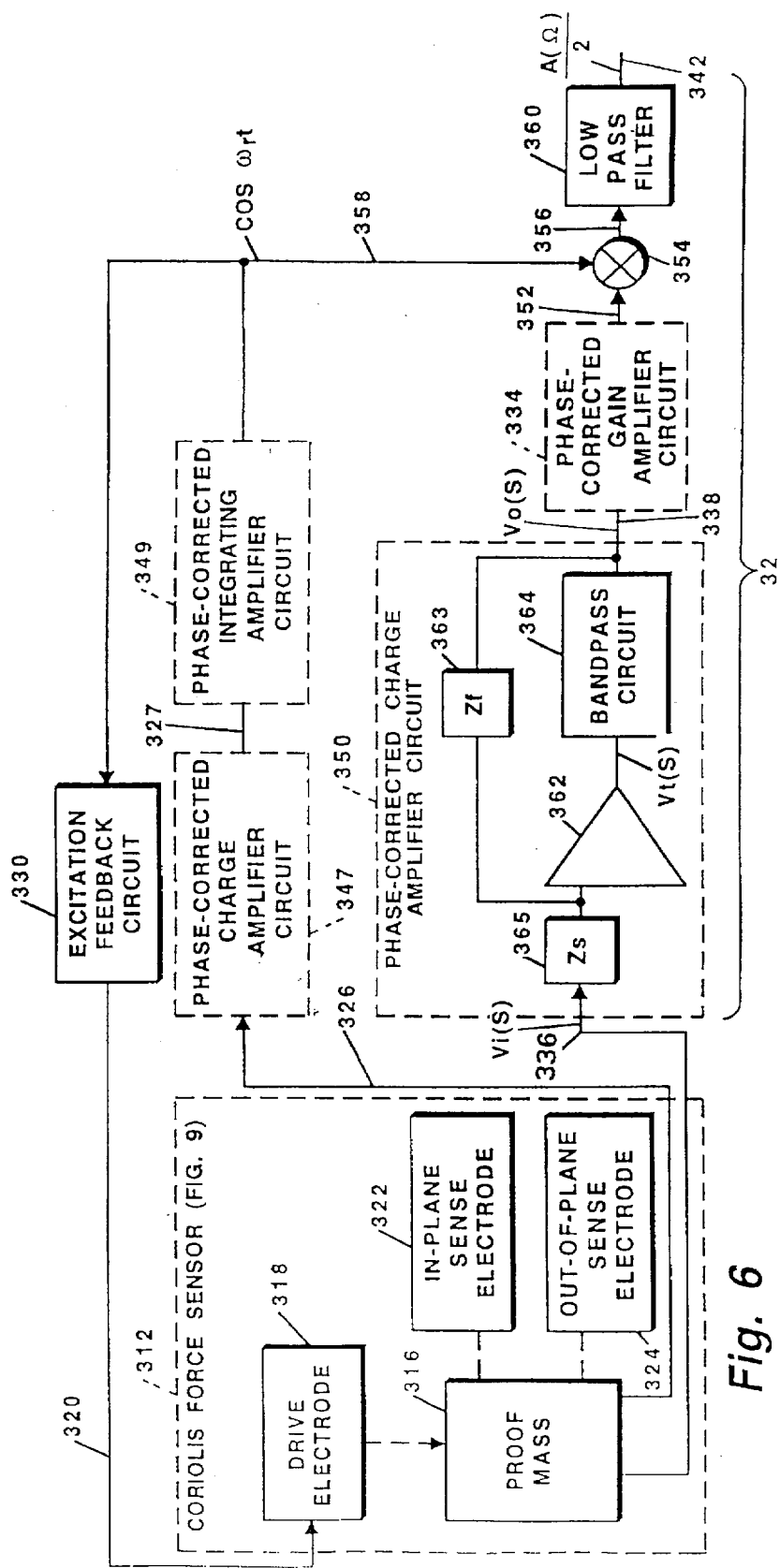
FIG. 6 is a block diagram of a Coriolis force sensor utilizing phase-corrected amplifier circuits in accordance with the present invention.

Referring to FIG. 6, a sensor system is shown to include a sensor 312 and accompanying processing electronics. The processing electronics include phase-corrected amplifier circuits 334, 347, 349, and 350 referred to hereinafter as amplifier, or composite amplifier, circuits. The amplifier circuits 334, 347, 349, and 350 will be described in detail in conjunction with illustrative amplifier circuit 350. Suffice it here to say that each of the amplifier circuits 334, 349, and 350 utilizes the phase-correction scheme of the present invention in conjunction with different functions. Specifically, amplifier circuit 350 is a charge amplifier for converting a charge signal into a voltage signal, amplifier circuit 349 is an integrating amplifier for providing a ninety degree phase shift, and amplifier circuit 334 is a gain stage amplifier. Each of the amplifier circuits has like components to the components 362–365 shown in exemplary amplifier circuit 350 but with different feedback and feedforward impedance networks $Z_f$, $Z_r$, respectively, to achieve the specified functions.

The phase-correction scheme of the present invention comprises the utilization of a bandpass circuit in cascade with the open-loop gain of the particular servo circuit. To this end, exemplary amplifier circuit 350 includes a bandpass circuit 364 in cascade with an operational amplifier 362 and a global feedback network 363 disposed around the cascade combination, as shown. The bandpass circuit 364 has a resonance frequency corresponding to the nominal frequency of information processed by the system. With this arrangement, the open-loop gain of the amplifier circuit 350 is boosted at the information frequency to significantly reduce gain and phase errors, as will be described below. Suffice it here to say that the bandpass circuit 364 provides such a gain boost while negligibly affecting the open-loop gain of the amplifier circuit 350 at frequency extremes, including at crossover, thereby ensuring circuit stability without requiring additional compensation circuitry.

Figure 12:
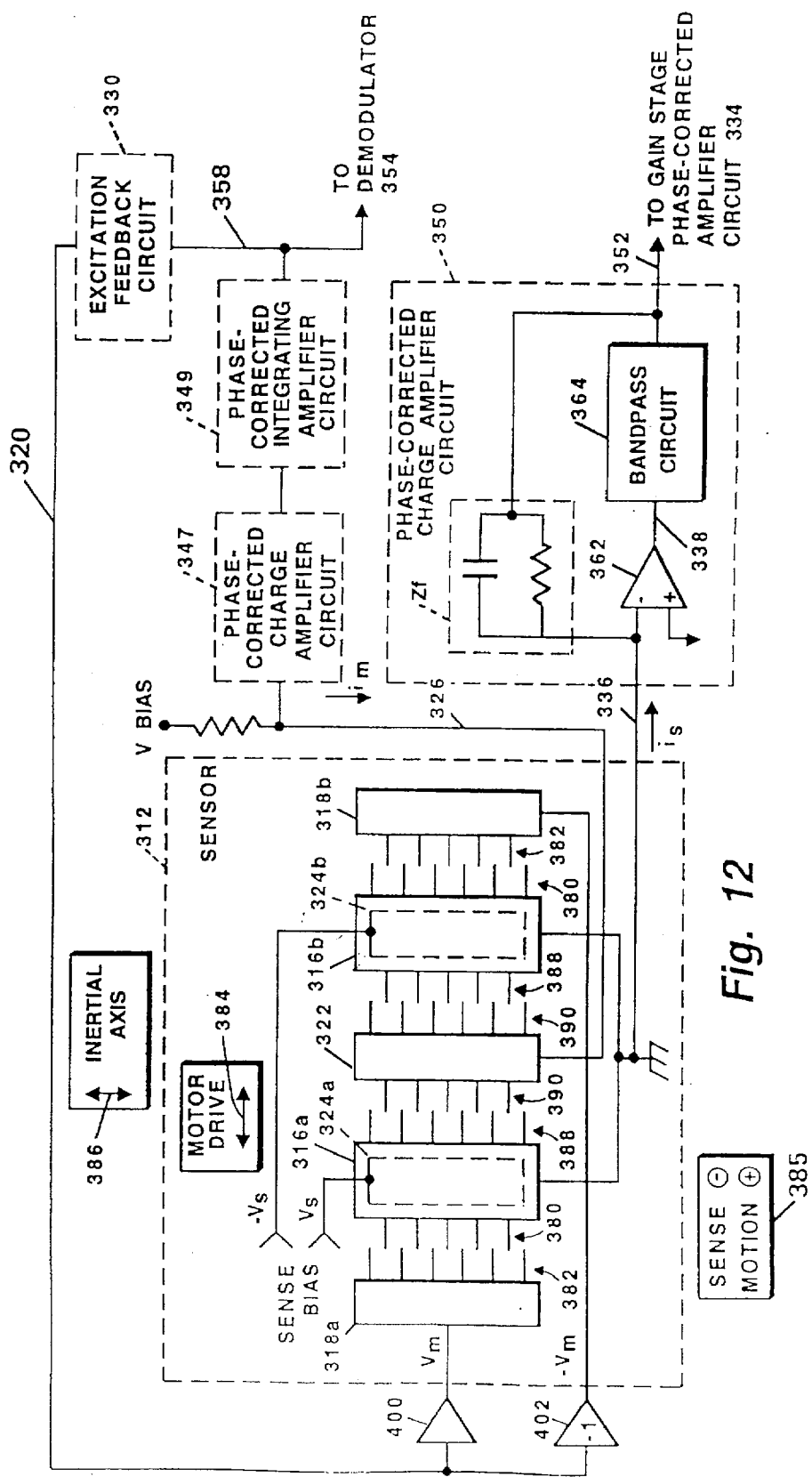
FIG. 12 shows a tuning fork gyroscope having sense electronics utilizing phase-corrected amplifier circuits of the type shown in FIG. 7.

It is initially noted that while the phase-corrected amplifier circuits are described herein for use in the sense electronics of a Coriolis force sensor of the type .shown in FIGS. 6 and 12, the amplifier circuits are advantageous for use in a variety of sensor applications in which the sensor output is accompanied by a quadrature term rendering reduced phase and gain error desirable, or in any sensor application where gain and phase sensitivities exist. Moreover, the phase-corrected amplifier circuits are advantageous for use in various servo applications other than sensors in which reduced phase and gain errors are desired.

The sensor 312 senses an inertial input which induces Coriolis forces. Accelerometers and gyroscopes, such as the tuning fork gyroscope shown in FIG. 12, are illustrative examples of the sensor 312. The Coriolis force sensor 312 includes a proof mass 316 adapted for being vibrated, or oscillated at a predetermined frequency in a plane in order to provide linear momentum. More particularly, a drive electrode 318, in electrostatic communication with the proof mass 316, receives a drive, or excitation, signal 320 from an excitation feedback circuit 330. The drive electrode 318 converts the excitation signal 320 into a force proportional to the square of the excitation signal 320 for driving the proof mass 316 and may be referred to generally as an electrostatic actuator. The frequency of the force on the proof mass 316, and that of the resulting vibration, corresponds to the resonant frequency of the proof mass 316. Preferably, the vibration force is derived from an excitation signal which lacks energy at the resonant frequency of the proof mass, as described above in conjunction with FIGS. 1–6.

The vibrating sensor 312 is responsive to an inertial input for causing the proof mass 316 to deflect out of the plane of vibration about an output axis orthogonal to the plane of vibration. More particularly, Coriolis forces induced by the inertial input cause the proof mass 316 to deflect out-of-plane in a vibratory manner at a rate equal to the frequency of the in-plane vibration and with an amplitude of deflection proportional to the inertial input. In the case of a gyroscope, the inertial input is a rotational rate, whereas in an accelerometer, the inertial input is a linear acceleration.

Sense electrodes 322, 324 are provided for sensing the proof mass displacement caused by the in-plane vibration and the out-of-plane deflection by measuring the capacitance between the proof mass 316 and the sense electrodes 322, 324, respectively. That is, the sense electrodes 322, 324 are stationary relative to the sensor 312, whereas the proof mass 316 moves in-plane in response to the drive signal 320 and out-of-plane in response to an inertial input. As the position of the proof mass 316 changes relative to the fixed position sensors 322, 324, capacitance indicative output signals 326, 336 provided by the sensors 322, 324, respectively, vary. As will be appreciated, the number of proof masses, drive electrodes, and sense electrodes, as well as the relative positioning thereof, may be varied. For example, the illustrative tuning fork gyroscope shown in FIG. 12 and described below includes a pair of proof masses 316a,b, a pair of drive electrodes 318a,b, a pair of out-of-plane senses electrodes 324a,b, and a single in-plane sense electrode 322.

The in-plane output signal 326 is coupled to a phase corrected charge amplifier circuit 347 which converts the charge signal 326 into a voltage signal in the same manner as like charge amplifier circuit 350 described below. That is, the charge to voltage conversion is achieved in a manner that greatly reduces phase and gain errors in accordance with the phase-correction scheme of the present invention, as will be discussed. The voltage output signal 327 of the charge amplifier circuit 347 is coupled to the input of a phase-corrected integrating amplifier circuit 349.

The integrating amplifier circuit 349 integrates the voltage signal 327 to provide a ninety degree phase shift and utilizes the phase-correction scheme of the present invention to provide greatly reduced phase and gain error. In order to achieve the integration function, the integrating amplifier circuit has a global feedback network $Z_f$ comprising a capacitor and a feedforward impedance network $Z_s$ comprising a resistor.

The excitation feedback circuit 330 is coupled in a feedback relationship between the output of the integrating phase-corrected amplifier circuit 349 and the drive electrode 318 for controlling the amplitude and frequency of the excitation signal 320 applied to the drive electrode 318. Preferably, the excitation feedback circuit 330 comprises the circuitry described above.

The processing electronics further includes a signal path 332 for processing the capacitance indicative sensor output signal 336 to provide a rate signal 342 proportional to the inertial input. The rate signal processing path 332 includes phase-corrected amplifier circuit 350 which receives the out-of-plane sensor output signal 336 ($V_i(s)$) and converts such charge indicative signal into a voltage signal 338 ($V_o(s)$). The amplifier circuit 350 includes an operational amplifier 362 in cascade with a bandpass circuit 364, as noted above and as discussed in greater detail below. Suffice it here to say that the phase-corrected amplifier circuit 350 converts the charge signal 336 into a voltage signal 338 in a manner that reduces gain and phase errors as compared to a conventional charge amplifier.

The voltage signal 338 is further processed by a gain stage phase-corrected amplifier circuit 334. More particularly, the gain stage amplifier circuit 334 differs from the charge amplifier circuit 350 in that the feedback impedance network $Z_f$ and the feedforward impedance network $Z_s$ of the former are arranged to provide a desired gain, instead of being arranged to convert a charge signal into a voltage signal in the manner of charge amplifier circuit 350. The gain stage amplifier circuit 334 provides an amplified output signal 352 to a demodulator 354, which additionally receives a signal 358 at the resonant frequency of the proof mass 316 from amplifier circuit 349 for demodulating the output signal 352 of the amplifier circuit 334. A low pass filter 360 filters the demodulated signal 356 to provide a rate signal 342 proportional to the inertial input to the sensor 312.

Ideally, the inertial output signal 336 is indicative only of the Coriolis forces induced by the inertial input to which the sensor 312 is subjected. However, the signal 336 has an additional quadrature term, caused by mechanical asymmetries, or out-of-plane deflection of the proof mass 316 which is ninety degrees out of phase with Coriolis induced deflection. The effect of the quadrature term on sensing the inertial input is aggravated by phase error, such as may be introduced by conventional charge amplification of the sensor output signal 336, due to the multiplicative effect of phase error on the quadrature signal. The phase-corrected amplifier circuit 350 reduces any such phase error, and thus, concomitantly reduces the effect of quadrature on the sensing of the inertial input.

The manner in which the phase-corrected amplifier circuits 334, 347, 349, and 350 reduce the phase error is by increasing the forward, or open-loop gain of the amplifier circuit so that the closed-loop transfer function thereof is dominated by the amplifier feedback, including the global feedback network $Z_f$ and the input feedforward network $Z_s$. More particularly, the closed-loop transfer function of the exemplary amplifier circuit 350 can be written as:

$$\frac{V_o(s)}{V_i(s)} = \frac{G(s)}{1+G(s)H(s)} \quad (12)$$

where $G(s)$ is the forward loop gain of the cascade combination of the operational amplifier 362 and the bandpass circuit 364 and $H(s)$ is the feedback ratio determined by the impedance networks $Z_f$ and $Z_s$. As $G(s)$ approaches infinity, the closed-loop transfer function of the amplifier circuit 350 is given by:

$$\frac{V_o(s)}{V_i(s)}\bigg|_{G(s)\to\infty} = \frac{1}{H(s)} \quad (13)$$

Since $H(s)$ is determined by the ratio of impedance networks $Z_f$ and $Z_s$ and is preferably temperature independent, the resulting closed-loop transfer function of the amplifier circuit 350 is also independent of temperature. More specifically, if the feedback ratio determined by $Z_f$ and $Z_s$ is either purely real or purely imaginary, then the resulting feedback ratio $H(s)$ will have a temperature independent phase associated therewith; whereas, if the impedance ratio is complex, temperature dependence of the phase of $H(s)$ will result. By significantly boosting the open-loop gain of amplifier circuit 350, the gain and phase of amplifier 350 are essentially determined by $H(s)$ alone. In this way, increasing the forward gain of the amplifier circuit 350 significantly reduces phase and gain errors.

Figure 7:
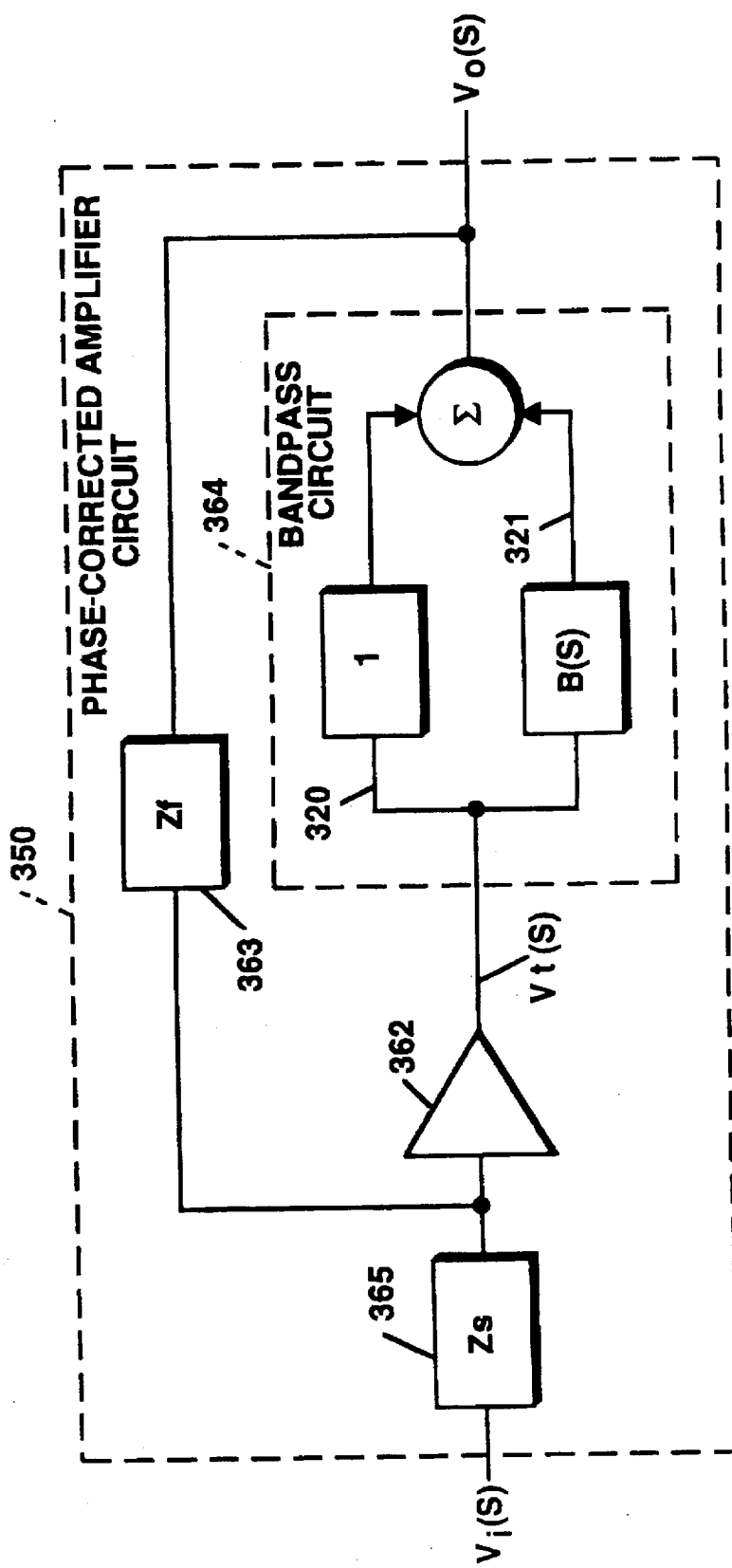
FIG. 7 is a block diagram of an exemplary one of the phase-corrected amplifier circuits of FIG. 6.

In order to achieve phase and gain error reduction by increasing the forward gain $G(s)$, without causing circuit instability or requiring additional compensation circuitry, the bandpass circuit 364 has a transfer function approximating one plus a bandpass characteristic, as shown in FIG. 7. With this arrangement, the bandpass circuit 364 has two parallel signal paths 320, 321, a first one 320 having unity gain and the second one 321 having a frequency dependent gain. The unity gain path 320 dominates the effect of the bandpass circuit 364 on the open-loop gain of the amplifier circuit 350 at the frequency extremes of DC and frequencies somewhat higher than the resonance frequency of the bandpass circuit 364, including at crossover. Thus, the bandpass circuit 364 has a negligible effect on the open-loop gain of the amplifier circuit 350 at such frequency extremes. Moreover, since the effect of the bandpass circuit 364 is negligible at crossover, the gain characteristic of the operational amplifier 362 dominates at crossover to ensure stability. The bandpass response of the frequency dependent path 321 dominates the effect of the bandpass circuit 364 on the amplifier circuit 350 near the information frequency to increase the gain and significantly reduce gain and phase errors, as discussed above.

More particularly, the forward loop gain G(s) of the amplifier circuit 350 can be written as follows:

$$G(s) = \frac{V_o(s)}{V_i(s)} \cdot \frac{V_t(s)}{V_i(s)} = K_1 \cdot \frac{V_o(s)}{V_t(s)} \quad (14)$$

where $V_t(s)$ is an intermediate signal in the amplifier circuit 350 at the output of the operational amplifier 362 and the input of the bandpass circuit 364, as shown, and $K_1$ is the open-loop gain of the operational amplifier 362. The transfer function of the bandpass circuit 364 can be written as follows:

$$\frac{V_o(s)}{V_t(s)} = 1 + B(s) = 1 + \frac{K_2 s}{s^2 + s(\omega_r/Q) + \omega_r^2} \quad (15)$$

where $\omega_r$ is the resonance frequency of the bandpass circuit 364, Q is the quality factor which is equal to the resonance frequency over the bandwidth of the circuit 364, and $K_2$ is the open-loop gain of a second operational amplifier comprising the bandpass circuit 364, as will be described below. From equation (15), it can be determined that the bandpass circuit 364 has a resonance gain as follows:

$$\frac{V_o(\omega_r)}{V_t(\omega_r)} = 1 + \frac{K_2 Q}{\omega_r} \quad (16)$$

Further consideration of equation (15) reveals that the gain of the bandpass circuit 364 approaches one at DC and at frequencies much greater than the resonance frequency. At the resonance frequency on the other hand, the bandpass circuit 364 provides the gain of equation (16), thereby significantly boosting the open-loop gain of the amplifier circuit 350, as compared to the use of a conventional charge amplifier to provide an open-loop gain of:

$$G(\omega_r) = K_1 + \frac{K_1 K_2 Q}{\omega_r} \quad (17)$$

With this arrangement, phase error is reduced by a factor of one plus the open-loop gain of the amplifier circuit 350 at the resonance frequency.

Figure 8:
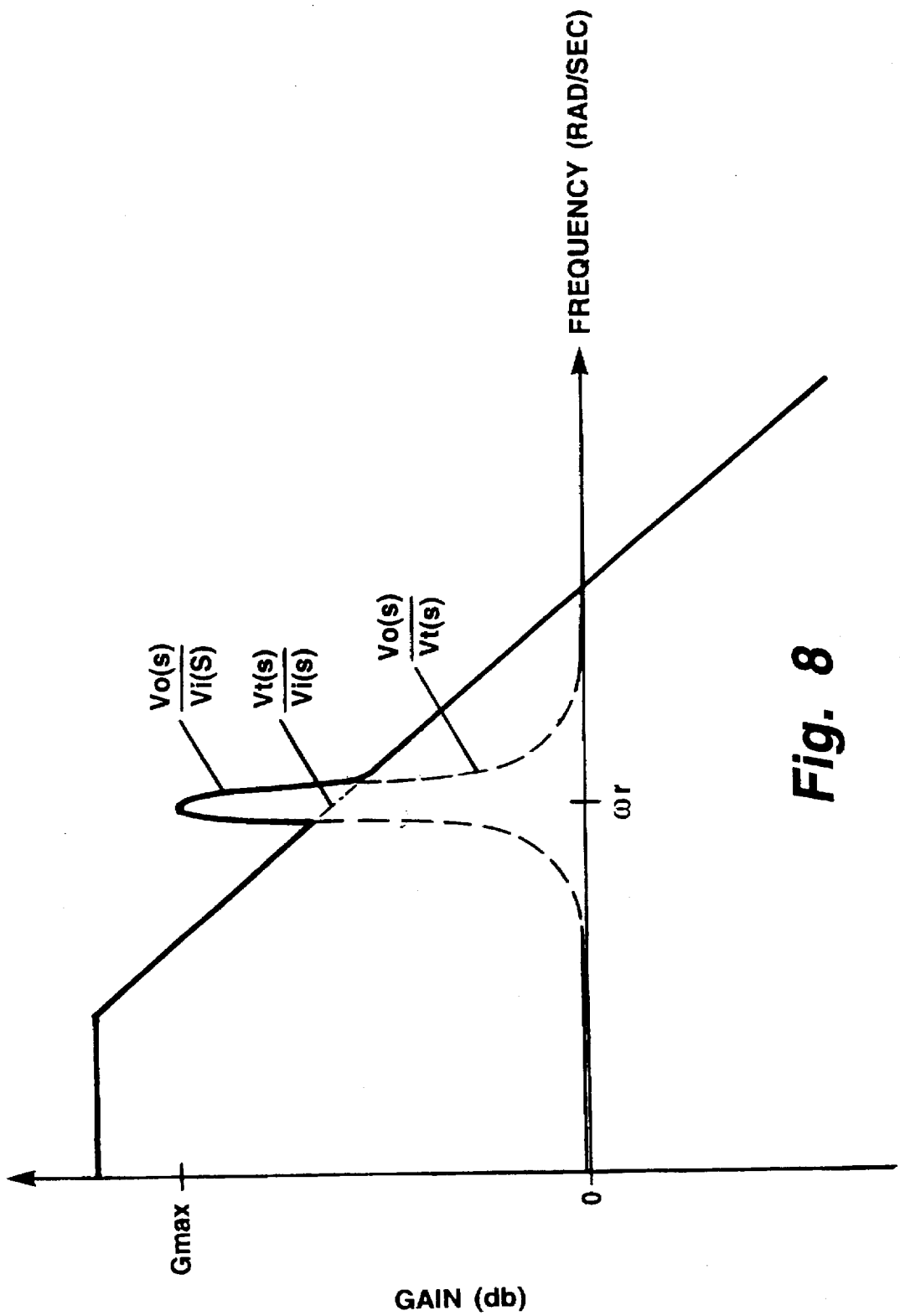
FIG. 8 is a plot of the open-loop gain of the phase-corrected amplifier circuit of FIG. 7 versus frequency.

Referring also to FIG. 8, frequency response curves are shown for the operational amplifier 362 (labelled $V_t(s)/V_i(s)$), the bandpass circuit 364 (labelled $V_o(s)/V_t(s)$), and the composite cascade arrangement of the amplifier circuit 350 including the operational amplifier 362 and the bandpass circuit 364 (labelled $V_o(s)/V_i(s)$). As is apparent, the open-loop gain of the operational amplifier 362 dominates the gain of the composite amplifier circuit 350 at DC and at crossover since the bandpass circuit 364 has unity gain (i.e., zero Db) at such frequencies. On the other hand, the bandpass circuit 364 dominates the gain of the composite amplifier circuit 350 over the passband around the resonance frequency $\omega_r$ to significantly increase the gain, as shown. With this arrangement, phase and gain errors are significantly reduced by increasing the open-loop gain of the amplifier circuit 350 at the information frequency in a manner that has a negligible effect on the stability of the circuit due to the negligible effect of the bandpass circuit 364 at crossover.

Figure 9:
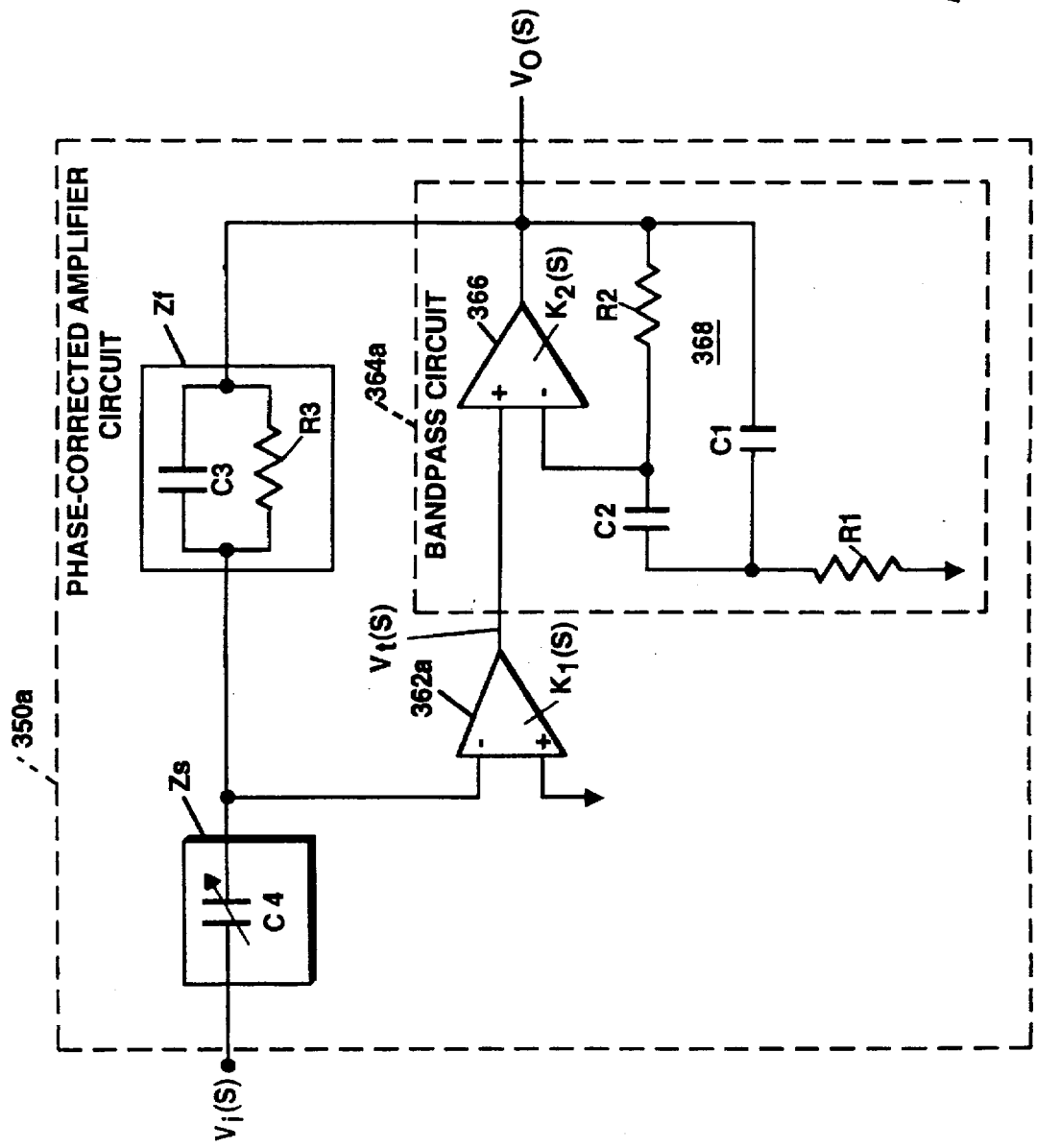
FIG. 9 is a schematic of one embodiment of the phase-corrected amplifier circuit of FIG. 7.

Referring to FIG. 9, a schematic of an embodiment 350a of the amplifier circuit 350 is shown to include an operational amplifier 362a and a bandpass circuit 364a. The bandpass circuit 364a includes a second operational amplifier 366 having a non-inverting input coupled to the output of the first operational amplifier 362a and an output providing the output terminal of the amplifier circuit 350a, at which the voltage signal $V_o(s)$ is provided. A global feedback network $Z_f$ is coupled between the output of the second operational amplifier 366 and the inverting input of the first operational amplifier 362a and includes a resistor $R_3$ in parallel with a capacitor $C_3$. A feedforward impedance network $Z_s$ has a first terminal coupled to the inverting input of the first operational amplifier 362a and a second terminal biased at a DC voltage. The impedance network $Z_s$ is comprised of a time-varying capacitance $C_4$ which represents the sense (i.e., out-of-plane) capacitance.

A local feedback network 368 is coupled between the output of the second operational amplifier 366 and an inverting input thereof, as shown. The feedback network 368 includes a resistor $R_2$ coupled between the output and inverting inputs of the second operational amplifier 366 and a capacitor $C_2$ coupled between the inverting input of the second operational amplifier 366 and a first terminal of a resistor $R_1$, the second terminal of which is coupled to ground. The network 368 further includes capacitor $C_1$ coupled between the output of the second operational amplifier 366 and the first terminal of the resistor $R_1$, as shown.

With the feedback network 368 as described, the transfer function of the bandpass circuit 364a is given by:

$$\frac{V_o(s)}{V_t(s)} = 1 + \frac{s\left(\frac{1}{R_1}\right)}{s^2 C + s\left(\frac{2}{R_2}\right) + \left(\frac{1}{R_1 R_2 C}\right)} \quad (18)$$

with a resonance gain of:

$$\frac{V_o(\omega_r)}{V_t(\omega_r)} = 1 + \left(\frac{R_2}{2R_1}\right) \quad (19)$$

a resonance frequency of:

$$\omega_r = \frac{1}{\sqrt{R_1 R_2 C^2}} \quad (20)$$

and a quality factor of:

$$Q = \sqrt{\frac{1 + \left(\frac{R_2}{2R_1}\right)}{2}} \quad (21)$$

where $C = C_1 = C_2$.

Figure 10:
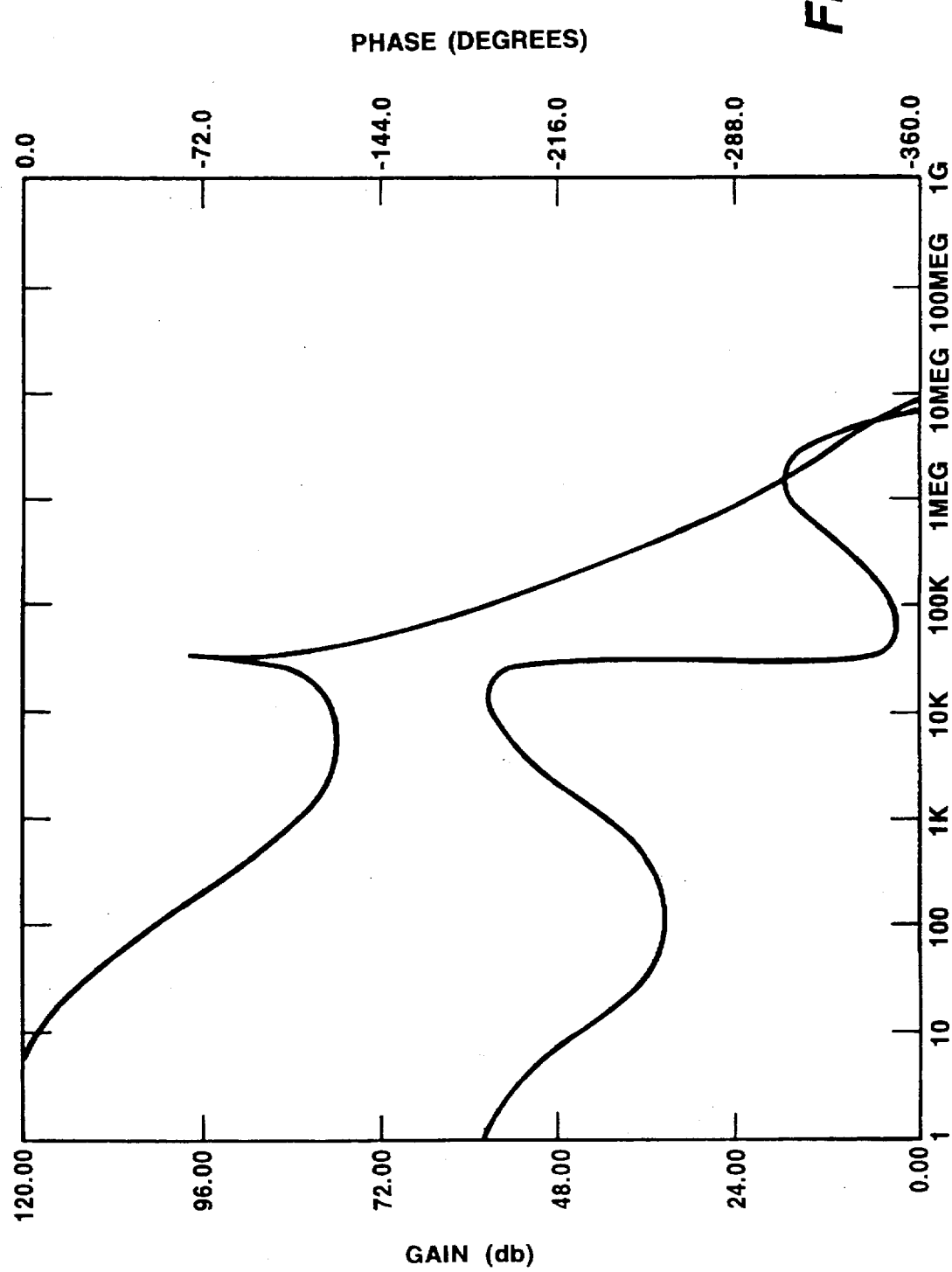
FIG. 10 is a plot of the open-loop gain and phase of the phase-corrected amplifier circuit of FIG. 9 versus frequency.

Referring to FIG. 10, the gain and phase versus frequency of the amplifier circuit 350a of FIG. 9 is shown. This plot corresponds to the following component values: $R_1 = 2.7$ Kohm, $R_2 = 1.0$ Mohm, $C_1 = 100$ pF and $C_2 = 100$ pF, $R_3 = 200$ Mohm, $C_3 = 1.0$ pF, and $C_4$ is a variable capacitor having a nominal capacitance of 5.0 pF. Operational amplifier 362a is an AD549 device having open-loop poles at one and two Mhz and operational amplifier 366 is an OP27 device having two open-loop poles at 10 MHz. The bandpass circuit a has a nominal resonance frequency of 30 KHz. As will be appreciated, the values of the amplifier circuit components will vary in accordance with the information frequency to which the resonance frequency of the bandpass circuit corresponds as well as the desired performance characteristics.

Preferably, the second operational amplifier 366 is faster than the first operational amplifier 362a, as is provided with the circuit of FIG. 9, in order to avoid additional phase lag at crossover to maintain a suitable phase margin without requiring additional compensation circuitry. Also, it is desirable that the resonance frequency of the bandpass circuit 364 be at least an order of magnitude below the crossover frequency in order to minimize the effect of the bandpass circuit 364 on the phase margin. More particularly, at high frequencies, such as crossover, the bandpass circuit 364a has a gain of:

$$\frac{V_o(\omega \gg \omega_r)}{V_i(\omega \gg \omega_r)} = \frac{K_2}{1+K_2} \quad (22)$$

so that the open-loop gain of the composite amplifier circuit 350a at crossover is:

$$\frac{V_o(\omega \gg \omega_r)}{V_i(\omega \gg \omega_r)} = \frac{K_1 K_2}{1+K_2} \quad (23)$$

Figure 11:
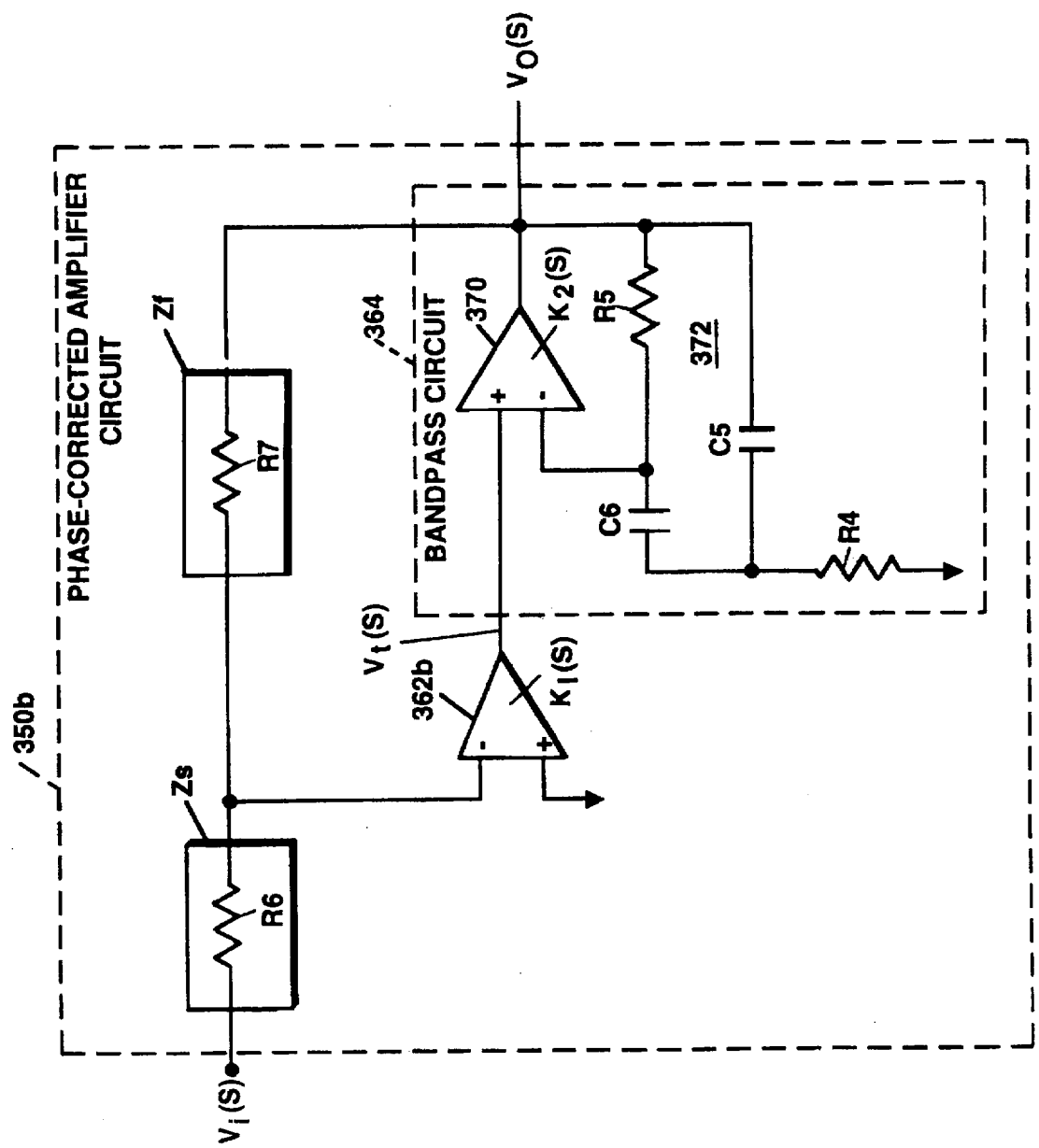
FIG. 11 is a schematic of an alternate embodiment of the phase-corrected amplifier circuit of FIG. 7.

Referring to FIG. 11, an alternate embodiment 350b of the phase-corrected amplifier circuit 350 of FIG. 7 is shown to include a first operational amplifier 362b and a bandpass circuit 364b. The amplifier circuit 350b of FIG. 11 differs from that of FIG. 9 in that the operational amplifiers 362b, 370 are both OP27 devices having an 8-Mhz gain-bandwidth product. Also, the feedback network $Z_f$ comprises a resistor $R_7$, such as a 10 Kohm resistor, and the feedforward impedance network $Z_s$ comprises a resistor $R_6$, such as a 1.0 Kohm resistor.

It will be appreciated that various other circuit arrangements may be used for realizing the preferred bandpass circuit transfer function of one plus a bandpass characteristic. Moreover, in certain applications, it may be desirable or necessary to utilize additional conventional compensation circuitry to ensure circuit stability.

A further advantage of the phase-corrected amplifier circuits of the present invention is a reduction in the stray feedback capacitance as compared to conventional charge amplifiers. That is, where the two operational amplifiers 362a, 366 of FIG. 9 for example, of the phase-corrected amplifier circuit 350 are implemented with discrete devices, the operational amplifiers are contained in different packages. Thus, such operational amplifiers 362a, 366 are separated by a greater distance than if only a single discrete operational amplifier were used. Moreover, the resulting reduction in stray capacitance improves the maximum signal to noise ratio of the amplifier circuit 350.

Referring to FIG. 12, an illustrative gyroscope sensor 312 is shown to include a pair of proof masses 316a,b, a pair of drive electrodes 318a,b, a pair of out-of-plane senses electrodes 324a,b, and a single in-plane sense electrode 322. More particularly, the gyroscope 312 is a micromechanical device fabricated on a substrate with the proof masses 316a,b supported by flexures attached to the substrate. Each of the proof masses 316a,b has comb-like electrodes 380 extending laterally therefrom and toward the adjacent one of the drive electrodes 318a,b, as shown. The drive electrodes 318a,b have complementary comb-like electrodes 382 extending toward, and interleaved with, the electrodes 380 of the adjacent one of the proof masses 316a,b. With this arrangement, the drive electrodes 318a,b electrostatically excite the proof masses 316a,b, respectively, to impart in-plane vibration to the proof masses 316a,b (in the directions shown by the arrow 384 labelled motor drive). More particularly, the drive electrodes 318a,b convert an excitation signal 320 into a force proportional to the square of the excitation signal 320 for driving the proof masses 316a,b and may be referred to generally as electrostatic actuators. As noted above, preferably, the excitation signal does not have energy at the resonant frequency of the proof masses 316a,b.

Sense electrode 322 is provided for sensing the displacement of the proof masses 316a,b in the plane of vibration. To this end, the proof masses 316a,b have additional comb-like electrodes 388 extending from a side opposite to the comb-like drive electrodes 380 and toward the sense electrode 322. The sense electrode 322 has complementary comb-like electrodes 390 extending from opposing sides thereof toward, and interleaved with, the electrodes 388 of adjacent proof masses 316a,b, as shown. The sense electrode 322 is supported by, and fixedly coupled to, the substrate so that the electrodes 390 extending therefrom are substantially vertically aligned with the electrodes 388 extending from the proof masses 316a,b. With this arrangement, the sense electrode 322 senses the distance to the adjacent proof masses 316a,b by measuring the capacitance therebetween. A bias voltage ($V_{bias}$) is coupled to the sense electrode 322, as shown, in order to enable detection of the in-plane proof mass displacement.

An output signal 326 indicative of the measured capacitance (i.e., charge variation) between the in-plane sense electrode 322 and the corresponding proof mass 316a, b, is coupled to phase-corrected charge amplifier circuit 347 and integrating phase-corrected amplifier circuit 349, as discussed above in conjunction with FIG. 6. The output signal 358 of the integrating amplifier circuit 349 is coupled to demodulator 354 and to an excitation feedback circuit 330 of the type described above. The output drive signal 320 of the excitation feedback circuit 330 is coupled to a pair of buffer amplifiers 400, 402, one of which inverts the drive signal, to provide drive signals $V_m$, $-V_m$, to the drive electrodes 318a, b, respectively, as shown.

The vibrating proof masses 316a,b are responsive to an input rotational rate about an input axis 386 (labelled inertial axis) coincident with the plane of vibration for causing the proof masses 316a,b to deflect out of the plane of vibration about an output axis 385 orthogonal to the plane of vibration (as labelled sense motion). More particularly, Coriolis forces induced by the input rotational rate cause the proof masses 316a,b to deflect in a vibratory manner out-of-plane at a rate equal to the frequency of the in-plane vibration and with an amplitude of deflection proportional to the input rotational rate.

Sense electrodes 324a,b are provided for sensing the antiparallel out-of-plane deflection of the proof masses 316a,b by measuring the differential capacitance between the proof masses 316a,b and the sense electrodes 324a,b, respectively. To this end, the sense electrodes 324a,b are disposed below a corresponding one of the proof masses 316a,b, respectively, and induce a charge on the adjacent one of the proof masses 316a,b proportional to the distance therebetween. A DC voltage $V_s$, $-V_s$ (labelled sense bias) is coupled to each of the out-of-plane sense electrodes 324a,b, respectively, for establishing a potential difference so that a change in the capacitance results in a change in charge on the proof masses 316a,b.

The sensor output signal 336 is coupled to phase-corrected amplifier circuit 350, of the type describe above in conjunction with FIG. 9. More particularly, the phase-corrected amplifier circuit 350 converts the charge indicative output signal 336 into la voltage signal 352 in a manner that significantly reduces gain and phase errors as compared to conventional charge amplification. The voltage signal 352 is coupled to a gain stage phase-corrected amplifier circuit 334 (FIG. 6) for further processing to provide a rate signal indicative of the input rotational rate to which the sensor 312 is subjected.

Quadrature Nulling

Figure 13:
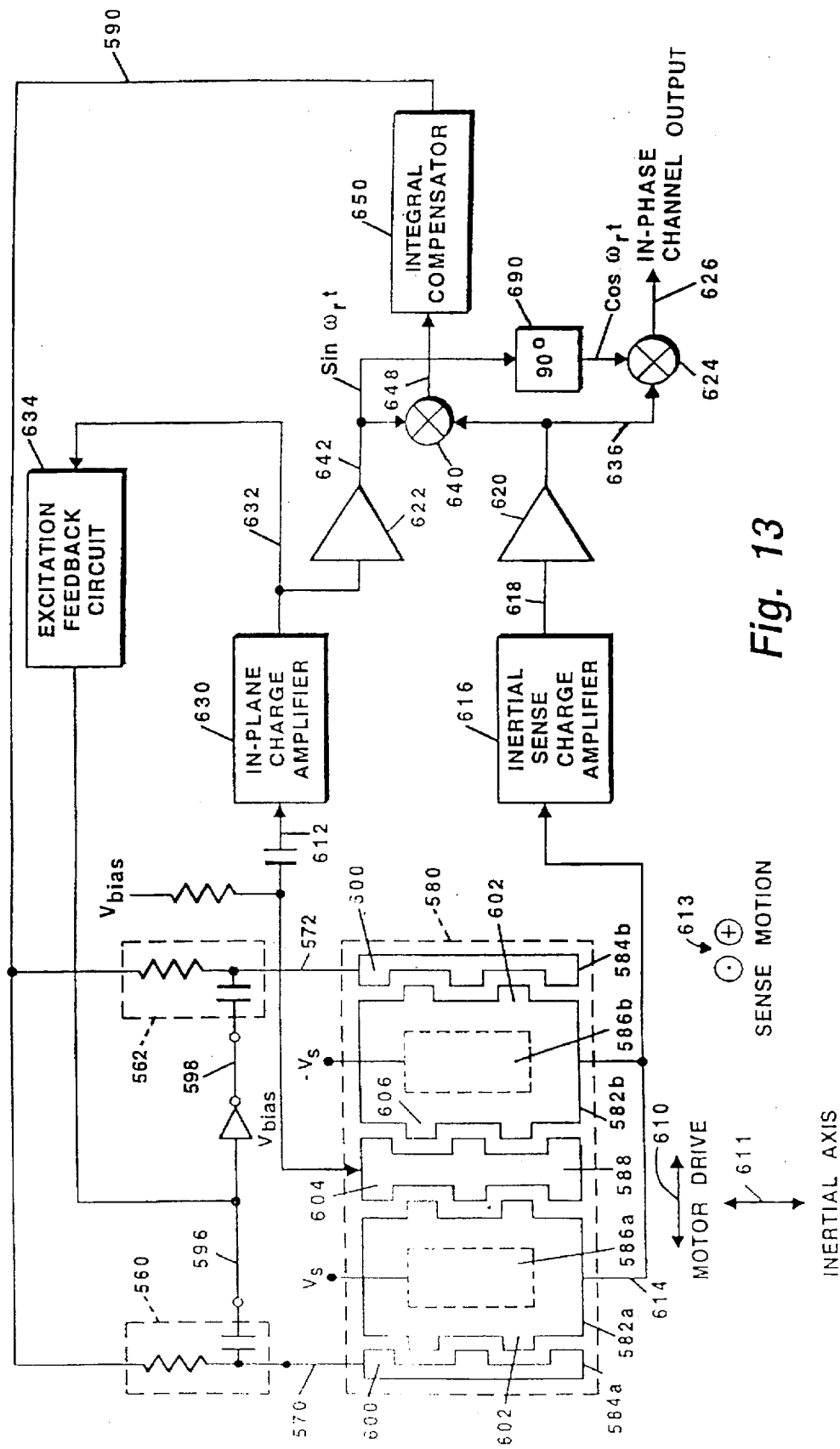
FIG. 13 is a schematic representation of an automatic quadrature nulling system for an in-plane micromechanical gyroscope.

Referring to FIG. 13, a tuning fork gyroscope sensor 580 includes a pair of proof masses 582a, b, a pair of in-plane drive electrodes 584a, b, a pair of out-of-plane sense electrodes 586a, b, and an in-plane sense electrode 588. The gyroscope 580 is a micromechanical device having a substrate above which the proof masses 582a, b and the in-plane sense electrode 588 are suspended, whereas the out-of-plane sense electrodes 586a, b are disposed on the substrate. More particularly, the proof masses 582a, b are suspended by support flexures permitting movement of the proof masses relative to the in-plane sense electrode 588, the out-of-plane sense electrodes 586a, b, and the substrate.

An integral compensator output signal 590, providing a DC component, and complimentary motor drive signals 596, 598, providing an AC component, are provided to summing circuits 560, 562, as shown. The resultant in-plane drive electrode inputs 570, 572 are coupled out of the summing circuits 560, 562, respectively.

The in-plane drive electrodes 584a, b have a plurality of comb-like electrodes 600 extending therefrom and toward an adjacent one of the proof masses 582a, b. Proof masses 582a, b have comb-like electrodes 602 extending toward the adjacent one of the in-plane drive electrodes 584a, b and interleaved with the electrodes 600 of the corresponding drive electrode. With this arrangement, electrostatic coupling of the in-plane drive electrode inputs 570, 572 to the corresponding proof masses 582a, b by the in-plane drive electrodes 584a, b imparts vibration to the proof masses in the plane of the gyroscope 580 and in the directions indicated by arrow 610 labelled motor drive.

The in-plane sense electrode 588 is disposed between the two proof masses 582a, b and has comb-like electrodes 604 extending from opposite sides thereof toward the adjacent one of the proof masses. Each of the proof masses has like electrodes 606 extending toward the in-plane sense electrode 588 and interleaved with the electrodes 604 of the in-plane sense electrode 588, as shown. A bias signal $V_{bias}$ is coupled to the in-plane sense electrode 588 to enable detection of charge variations caused by displacement of the proof masses 582a, b in the plane of vibration.

The in-plane motion of the proof-masses must be detected so that oscillation amplitude can be controlled. The motion is sensed by detecting the variation in capacitance between the masses 582a, b (at virtual ground potential), and the in-plane sense electrode 588 which is biased at $V_{bias}$. The result is a current flowing into the in-plane sense electrode 588. It is this current, reflective of the capacitive charge developed between the proof masses 582a, b and the in-plane sense electrode 588, which is used as an input to an excitation feedback circuit 634 and as a drive frequency reference 642.

In response to an inertial input, and specifically to a rotational rate about an input axis coplanar to the plane of vibration (labelled inertial axis 611), the proof masses 582a, b deflect out of the plane of vibration (i.e., about an output axis orthogonal to the input axis as labelled sense motion 613). Such out-of-plane deflection of the proof masses 582a, b occurs at a frequency corresponding to the resonant frequency of the proof masses and with an amplitude, or magnitude, corresponding to the input rotational rate. Thus, detection of the out-of-plane deflection of the proof masses 582a, b provides a measure of the rotational rate.

As noted, in known in-plane gyroscopes, a servo system is employed to establish sinusoidal in-plane proof-mass motion of fixed amplitude. Since the frequency of the proof-mass motion is essentially constant due to a high system Q, the in-plane velocity of the masses is also essentially constant. Application of an inertial rate about the inertial axis 611 generates a Coriolis force, proportional to the in-plane velocity and the inertial rate, which excites out-of-plane motion at the same frequency as the in-plane motion. The amplitude of the out-of-plane motion is thus proportional to the input inertial rate.

Unfortunately, the motor motion established in the absence of rotation is not completely in-plane. An unwanted out-of-plane motion which is tied to the in-plane motion is generated by mechanical out-of-plane asymmetries. The unwanted out-of-plane motion resulting from this asymmetry is in time quadrature with, or orthogonal to, the motor velocity and thus the desired out-of-plane component. This unwanted component is referred to as "quadrature" and can be many times the minimum detectable motion of the gyroscope. Thus the quadrature signal limits the AC gain in front of a baseband demodulator, resulting in poor bias stability for the system, and gives rise to a sensitivity to phase in the sensor and associated electronics.

Figure 14:
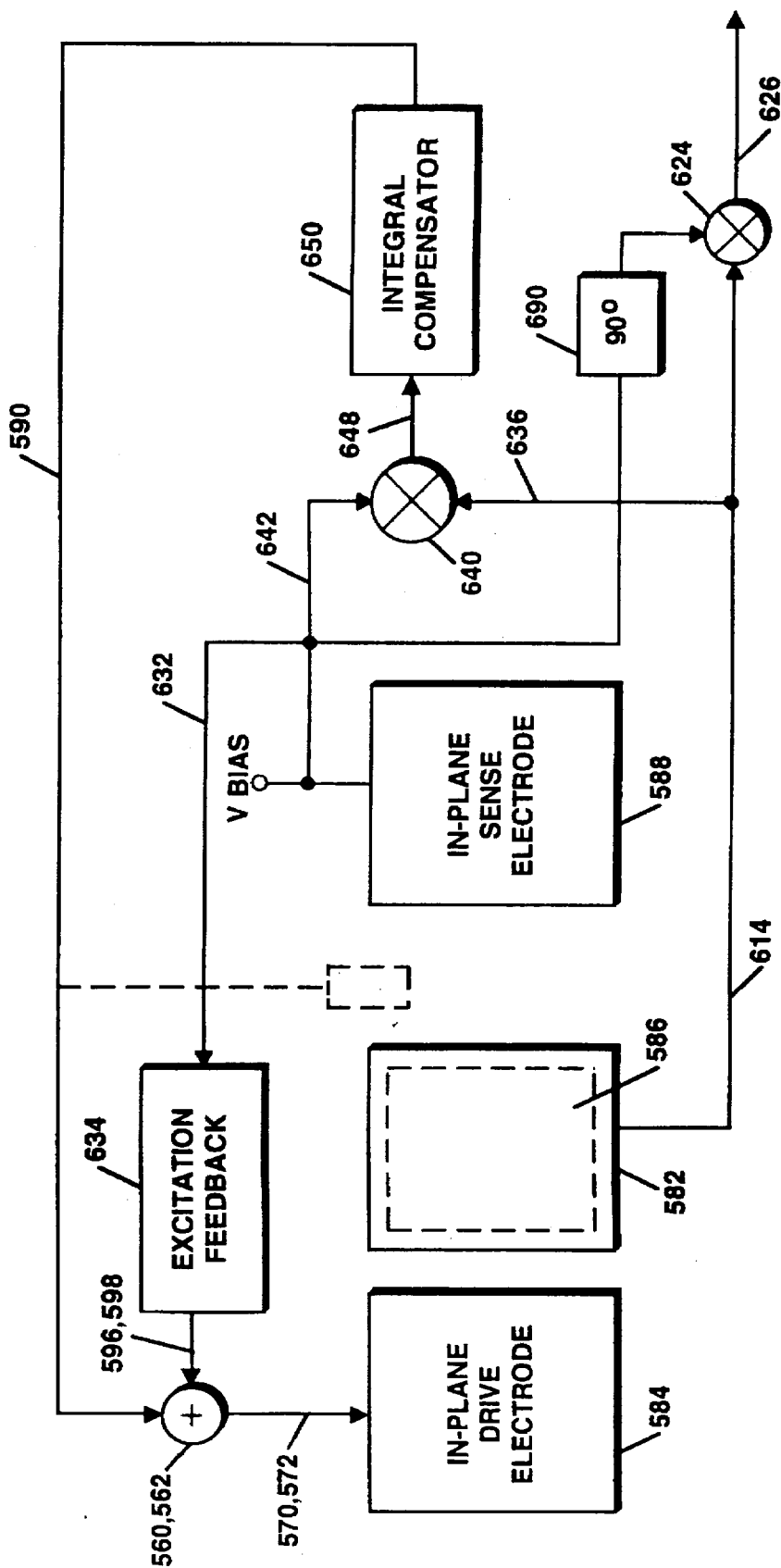
FIG. 14 is a simplified schematic representation of the quadrature nulling system of FIG. 13.

The present invention is represented in a simplified manner in FIG. 14. The quadrature component of an inertial sense signal 614, also referred to as an out-of-plane charge signal 614, is nulled by generating a DC voltage 590 related to the amplitude of the quadrature component in the out-of-plane charge signal 614 and applying such DC voltage to the drive electrodes 584a, b via summing circuits 560, 562. More particularly, this DC voltage 590 generates a proportional current in-phase with motor position, and in quadrature with Coriolis induced out-of-plane motion in the proof-masses 582a, b. The DC potential on the in-plane drive electrodes 584a, b is automatically adjusted by an integral compensator 650, as discussed below, such that the resulting charge developed on the proof-masses 582a, b and associated sense electrodes 586a, b is exactly in-phase with the motor induced capacitance between the proof-masses 582a, b and the sense electrodes 586a, b. This technique results in the generation of perfectly phased signals and thus provides correction of out-of-phase error components such as the quadrature component discussed herein. Although FIG. 14 shows the compensator DC voltage summed with the excitation feedback, the DC voltage can be directly applied to any electrode in electrostatic communication with the proof-mass or any moving structure to result in a signal which is perfectly phased with respect to the motion, for the purpose of compensating for signal errors. This is suggested by the dotted lines in FIG. 14.

Again with reference to FIG. 13, the out-of-plane sense electrodes 586a, b each receive a voltage $V_S$, $-V_S$ for establishing a potential difference so that a change in the capacitance between the electrodes 586a, b and the adjacent proof masses 5S2a, b results in a change in charge on the proof masses 582a, b. An inertial sense signal 614 from the proof masses is thus a charge signal indicative of the out-of-plane deflection thereof. The complimentary sense electrode voltages $V_S$, $-V_S$ result in proof-mass currents which reinforce. $V_S$, $-V_S$ can be DC voltages (in a carrierless system), or a voltage varied over time (in a carrier system). In the carrier system, the magnitude of current and thus the gain is larger than in the carrierless system. However, decreasing charge amplifier 616 gain with frequency provides identical sensitivity for either system at the demodulated output 626.

Figure 15:
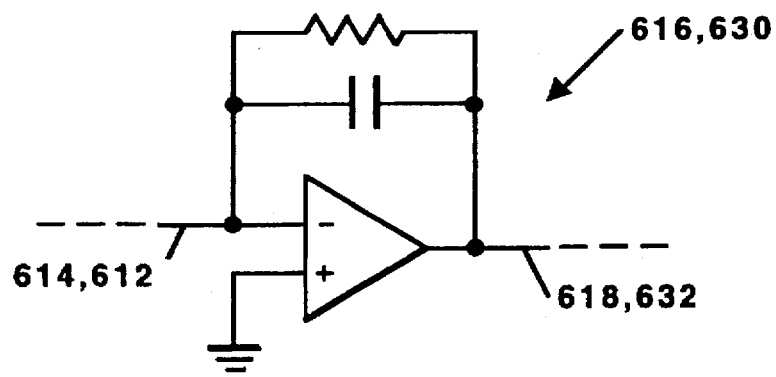
FIG. 15 is a schematic diagram of a charge amplifier as used in the quadrature nulling system of FIG. 13.

The inertial sense signal 614 is coupled to an inertial sense charge amplifier 616 for conversion of the charge signal 614 into an inertial voltage signal 618. The voltage signal 618 may be amplified by an amplifier circuit 620. Likewise, in-plane sense signal 612 is coupled to an in-plane charge amplifier 630 for conversion to a drive feedback signal 632, which is preferably provided to an off-frequency drive scheme 634 as described above with respect to FIGS. 1–5. However, the excitation feedback circuit 634 associated with the present quadrature hulling scheme, to be described, can be an automatic gain control circuit as presently known in the art. Additionally, while the inertial sense charge amplifier 616, the gain stage amplifier 620, and the in-plane charge amplifier 630 preferably utilize the phase correction technique described above in conjunction with FIGS. 6–12, the quadrature nulling scheme to be described can provide a desired quadrature-free output employing known filtering circuits. A typical charge preamplifier circuit is illustrated in FIG. 15.

The voltage feedback signal 632 can pass through a gain stage amplifier 622, resulting in a reference sinusoid 642 represented by $B\sin(\omega_r t + \theta_1)$, or essentially $B\sin\omega_r t$, where B is the in-plane signal amplitude, and $\omega_r$ is the reference frequency of $V_{bias}$ (i.e., corresponding to the resonant frequency of the proof-masses 582a, b). The inertial signal 636 can be represented by $A\cos(\omega_r t + \theta_2) + Q\sin(\omega_r t + \theta_2)$, where A is the inertial signal amplitude, and Q is the quadrature component amplitude.

A multiplier 640 demodulates the inertial signal 636 by multiplying the inertial signal 636 by the reference sinusoid 642 to provide a mixer output $V_{om}$ 648 as given in the following equations:

$$V_{om}=BM(A)(\Omega) \ (\sin(2\omega_r t+\Sigma\theta)+\sin\Delta\theta)+Q(\cos\Delta\theta-\cos(2\omega_r t+\Sigma\theta))\}/24)$$

where $$\Sigma\theta=\theta_1+\theta_2 \quad (25)$$

and $$\Delta\theta=\theta_1-\theta_2 \quad (26)$$

Figure 16:
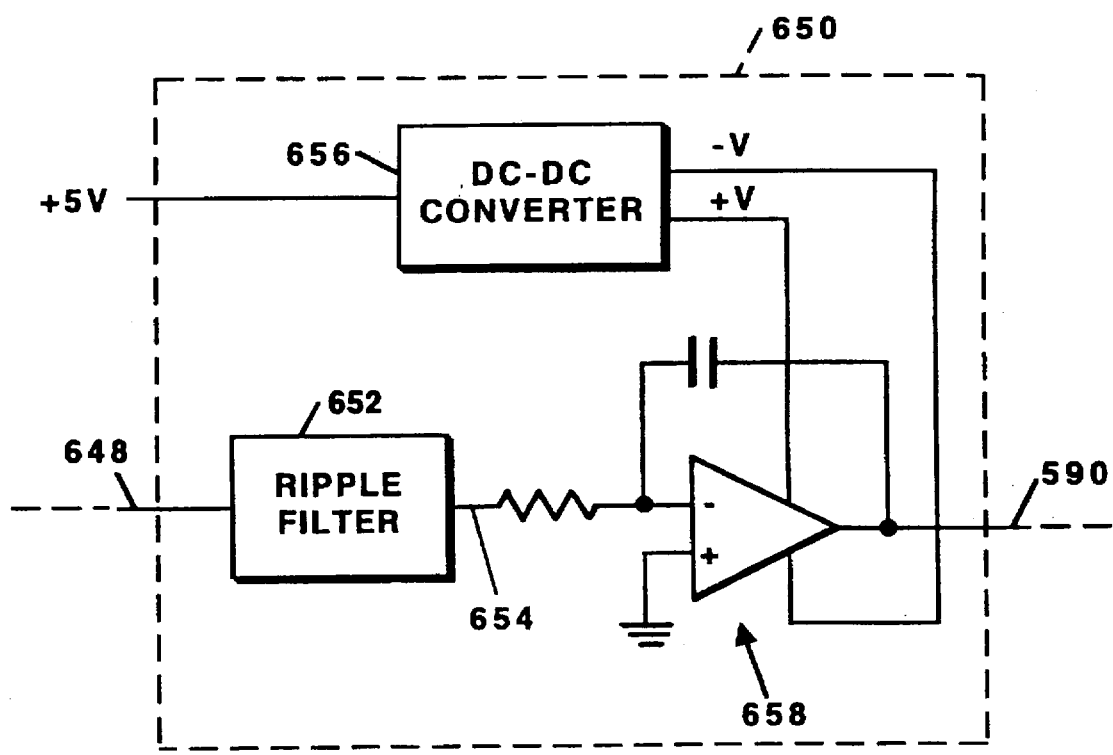
FIG. 16 is a schematic diagram of an integral compensator as used in the quadrature nulling system of FIG. 13.

The mixer output $V_{om}$ 648 is coupled to an integral compensator 650, schematically illustrated in FIG. 16. The front end of the integral compensator 650 preferably provides a ripple filter 652 which filters out high frequency components of the mixer output 648, resulting in an integrator input 654 of:

$$V_{ii}=BM(A)(\Omega) \ (\sin\Delta\theta+Q\cos\Delta\theta)=BMQ \quad (27)$$

Thus, the filtered integrator input 654 is proportional to the amplitude Q of the quadrature signal.

Initially ignoring mixer and integrator offset, the mixer output $V_{om}$ 648 is driven to null, resulting in a residual quadrature amplitude of:

$$Q=-A\tan\Delta\theta\approx-A\Delta\theta \quad (28)$$

Thus, the in-phase channel output $V_{oi}$ 626, referred to the inertial sense charge amplifier output 618, is given by:

$$V_{oi}=A\cos\Delta\theta+A\tan\Delta\theta\sin\Delta\theta \quad (29)$$

Including the mixer and integrator offset results in:

$$V_{oi}=A\cos\Delta\theta+[A\tan\Delta\theta-V_o/M]\sin\Delta\theta \quad (30)$$

Thus, the in-phase channel output 626 does not contain a quadrature amplitude term.

An integrator circuit 658 integrates the ripple filtered mixer output 654 to provide the integral compensator output signal 590, a DC bias of magnitude which provides a quadrature current into the sense amplifier 616 that exactly cancels the uncompensated quadrature current. A DC-DC converter 656 is optionally provided to power the integrator circuit 658, since the quadrature signal amplitude and thus the required DC bias 590 can be relatively large.

Thus, the quadrature nulling scheme has as an input a signal (i.e. reference sinusoid 642) representative of the magnitude of a drive voltage (i.e. $V_{bias}$) used to impart sinusoidal in-plane motion in the proof-masses 582a, b and the magnitude of a quadrature component in a sensed signal (i.e. inertial signal 636) representative of out-of-plane proof-mass 582a, b motion in quadrature with in-plane motor induced motion. The output of the integrator circuit 658 provides a DC offset 590 which, when summed with a second drive voltage 596, 598, generates a proportional current in-phase with motor position, and in quadrature with Coriolis out-of-plane motion.

The excitation feedback circuit 634 is coupled in a feedback relationship between the output of the in-plane charge amplifier circuit 630 and the in-plane drive electrodes 584a, b for controlling the amplitude and frequency of the complimentary motor drive signals 596, 598. These drive signals 596, 598, providing an AC component to the in-plane drive electrode inputs 570, 572, are coupled to the summing circuits 560, 562. Also coupled to the summing circuits 560, 562 is the integral compensator output signal 590, providing a DC offset component to the in-plane drive electrodes 584a, b. The resultant electrode inputs 570, 572 provide both motor drive and hulling of the quadrature component in the inertial signal 636, thus eliminating the effects of the quadrature signal at the in-phase channel output 626.

A multiplier 624 demodulates the inertial output signal 636 by multiplying such signal 636 by a cosine signal at the resonant frequency of the proof masses. The cosine is derived from the reference sinusoid 642 by coupling the sinusoid to an input to a ninety-degree phase shifter 690. The output of the multiplier 624 provides the in-phase channel output 626 indicative of the input rotational rate to which the sensor 580 is subjected. In practice, while a linear multiplier can be employed as the multipliers 624, 640, a switching demodulator having a gain of 2/pi is preferably used.

Having described the preferred embodiments of the invention, it will be apparent to one of skill in the art that other embodiments incorporating their concepts may be used. Accordingly, the invention should be limited only by the spirit and scope of the appended claims.

I claim:

1. A negative feedback servo system having an input and an output and being responsive to information at an information frequency, said servo system comprising:

a forward gain stage coupled between said input and said output of said servo system and having an open-loop gain; and a bandpass circuit having an input and an output and a transfer function relating said output to said input, said transfer function comprising a bandpass characteristic substantially centered at said information frequency, wherein said bandpass circuit is disposed in cascade with said forward gain stage, between said input and said output of said servo system.

2. The servo system recited in claim 1 wherein said transfer function of said bandpass circuit approximates one plus said bandpass characteristic.

3. The servo system recited in claim 1 wherein said forward gain stage comprises:

a first operational amplifier having a gain and being disposed in cascade with said bandpass circuit; and a feedback network coupled between said output of said bandpass circuit and an input of said first operational amplifier.

4. The servo system recited in claim 3 wherein said bandpass circuit has a resonance frequency corresponding to said information frequency and an open-loop gain and said servo system has a composite open-loop gain proportional to the sum of said open-loop gain of said forward gain stage and said open-loop gain of said bandpass circuit, and wherein said bandpass circuit comprises two parallel signal paths, a first one of said signal paths having a gain substantially independent of frequency and dominating said open-loop gain of said bandpass circuit at frequency extremes so that said composite open-loop gain of said servo system is governed by said gain of said first operational amplifier at said frequency extremes, and a second one of said signal paths having a frequency dependent gain dominating said open-loop gain of said bandpass circuit at said resonance frequency so that said composite open-loop gain of said servo system is governed by said open-loop gain of said bandpass circuit at said resonance frequency.

5. The servo system recited in claim 3 wherein said bandpass circuit comprises:

a second operational amplifier having a non-inverting input coupled to an output of said first operational amplifier, an output providing said output of said bandpass circuit; and a feedback network coupled between said output of said bandpass circuit and an inverting input of said second operational amplifier, wherein said feedback network provides said transfer function of said bandpass circuit.

6. A servo system comprising:

a first operational amplifier having a gain;

a bandpass circuit having a resonance frequency and an open-loop gain, wherein said servo system has a composite open-loop gain proportional to the sum of said gain of said first operational amplifier and said open-loop gain of the bandpass circuit, said bandpass circuit disposed in cascade with said first operational amplifier and comprising two parallel signal paths, a first one of said signal paths having a gain substantially independent of frequency and dominating said open-loop gain of said bandpass circuit at frequency extremes so that said composite open-loop gain of said servo system is governed by said gain of said first operational amplifier at said frequency extremes, and a second one of said signal paths having a frequency dependent gain dominating said open-loop gain of said bandpass circuit at said resonance frequency so that said composite open-loop gain of said servo system is governed by said open-loop gain of said bandpass circuit at said resonance frequency; and a feedback network coupled between an input of said first operational amplifier and an output of said bandpass circuit.

* * * * *

UNITED STATES PATENT AND TRADEMARK OFFICE
CERTIFICATE OF CORRECTION

PATENT NO. : 5,672,949
DATED : September 30, 1997
INVENTOR(S) : Paul Ward

It is certified that error appears in the above-identified patent and that said Letters Patent is hereby corrected as shown below:

Column 3, line 18, "an-in-plane" should read --an in-plane--.

Column 5, line 30, "hulled" should read --nulled--.

Column 10, line 40, "hulling" should read --nulling--.

Column 14, line 39, ".shown" should read --shown--.

Column 22, line 63, "5S2a,b" should read --582a,b--.

Column 23, line 17, "hulling" should read --nulling--.

Column 23, line 42, equation 24, "(A)(Ω)" should read --(A(Ω)--.

Column 24, line 43, "hulling" should read --nulling--.

Signed and Sealed this

Twelfth Day of October, 1999

Attest:

Q. TODD DICKINSON

*Attesting Officer*    *Acting Commissioner of Patents and Trademarks*